(12) United States Patent  
Nishikawa et al.

(10) Patent No.: US 8,237,505 B2  
(45) Date of Patent: Aug. 7, 2012

(54) SIGNAL AMPLIFICATION CIRCUIT

(75) Inventors: Mutsuo Nishikawa, Matsumoto (JP);  
Katsuyuki Uematsu, Hata-machi (JP);  
Kazuhiro Matsunami, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 243 days.

(21) Appl. No.: 12/588,123

(22) Filed: Oct. 5, 2009

(65) Prior Publication Data

US 2010/0097146 A1    Apr. 22, 2010

(30) Foreign Application Priority Data

Oct. 16, 2008 (JP) ................................. 2008-267242

(51) Int. Cl.  
*H03F 1/08* (2006.01)  
*H03F 3/45* (2006.01)  
(52) U.S. Cl. ........................................ 330/293; 330/253  
(58) Field of Classification Search .................. 330/293, 330/252, 253  
See application file for complete search history.

(56) References Cited

U.S. PATENT DOCUMENTS

| 7,046,013 B2 | 5/2006 | Uematsu et al. |
| 2007/0290761 A1 | 12/2007 | Nishikawa et al. |

FOREIGN PATENT DOCUMENTS

| JP | 07-209326 A | 8/1995 |
| JP | 2003-304633 A | 10/2003 |
| JP | 2005-328151 | 11/2005 |
| JP | 2007-312368 A | 11/2007 |

*Primary Examiner* — Robert Pascal  
*Assistant Examiner* — Khiem Nguyen  
(74) *Attorney, Agent, or Firm* — Rabin & Berdo, P.C.

(57) ABSTRACT

This invention provides a low-current consumption type signal amplification circuit, which limits the output voltage to fix a lower-limit (upper-limit) saturation voltage of the amplification circuit at a predetermined lower-limit (upper-limit) limiting voltage. The signal amplification circuit comprises a negative feedback amplification circuit, a lower-limit voltage limiting circuit and an upper-limit voltage limiting circuit. The lower-limit voltage limiting circuit increases a resistance between an output terminal of the negative feedback amplification circuit and a ground terminal when the output voltage of the negative feedback amplification circuit falls below the lower-limit limiting voltage. The upper-limit voltage limiting circuit increases a resistance between the output terminal of the negative feedback amplification circuit and a high-potential side of a power supply when the output voltage of the negative feedback amplification circuit rises above the upper-limit limiting voltage.

11 Claims, 19 Drawing Sheets

SIGNAL AMPLIFICATION CIRCUIT

BACKGROUND OF THE INVENTION

1. Field of the Invention

This invention relates to a signal amplification circuit for electrical and electronic equipment, used in automobiles, two-wheeled motor vehicles, and in industry, and in particular relates to a signal amplification circuit of a semiconductor physical quantity sensor used in automobiles and two-wheeled motor vehicles.

2. Description of the Related Art

At present, in the fields of automobiles and two-wheeled motor vehicles, there is an accelerating move toward control by electrical and electronic components of portions that heretofore had been controlled by mechanical components.

Moreover, electronic component products used in the past are becoming increasingly precise and multifunctional, aiming at more sophisticated control.

For example, pressure sensors used to measure the pressure within an intake manifold or to measure brake hydraulic pressure are now required to have a function to detect their own malfunction (a diagnostic function), in addition to a function for measuring and outputting the pressure.

FIG. 6 shows the configuration of principal portions of a pressure sensor of the prior art. The pressure sensor comprises a signal amplification circuit 10c including an op-amp 41; a pressure is converted into an electrical signal by the piezoelectric effect in the pressure detection portion, this electrical signal is inputted to positive and negative input terminals 011 and 012 processed by the signal amplification circuit 10c, and the processed signal is output from an output terminal 02 of the signal amplification circuit 10c (which is also an output terminal of the pressure sensor) to an ECU (Engine Control Unit).

The diagnostic function enables the sensor itself to detect breakage of wiring connecting the pressure sensor to the ECU (breakage of a wire bonding wire, lead frame, wiring harness, or similar), and transmits this information to the ECU; by means of this function, in the unlikely event of a malfunction the malfunction can be detected, and a failsafe function can ensure that a major problem is prevented.

FIG. 7 is a conceptual diagram (graph) representing output characteristics and diagnostic functions of a pressure sensor. The X axis indicates the pressure (in kPa) measured by the sensor, and the Y axis indicates the output voltage (in V) output from the pressure sensor. The following explanation is of a general nature; a more detailed explanation is given later.

Until now, pressure sensors not having diagnostic functions have had only functions to output only certain determined voltages according to the measured pressure, and specifically, to output voltages in the range Vb to Vc in FIG. 7 (the steady output range).

On the other hand, a pressure sensor having a diagnostic function employs a mode in which voltages equal to or lower than the output Va and equal to or greater than the output Vd of the pressure sensor (diagnostic regions) are output when breakage of a wire or similar occurs, in addition to the above-described steady output range; when a voltage in a diagnostic region is received by the ECU, an anomalous state of the pressure sensor is detected.

Here, in order to realize a diagnostic function for a pressure sensor, the following two engineering means are necessary.

(1) Means for outputting a voltage in a diagnostic region when breakage of a wire, wiring harness, or similar occurs (2) Means for not outputting a voltage in a diagnostic region when the pressure sensor is in the normal state The means (1) is disclosed in Japanese Patent Application Laid-open No. 2003-304633, and is here omitted.

Next, with respect to the means (2), in the prior art, utilization of the saturation voltage of a signal processing signal (e.g., output operational amplifier: op-amp 41 in FIG. 6) is the method most generally used.

FIG. 8 is a circuit diagram of a signal processing circuit used as a general signal processing circuit for a pressure sensor. This signal processing circuit 10c is a negative feedback amplification circuit 40, comprising a differential amplifier circuit 40a and a resistor 46; the differential amplifier circuit 40a comprises an op-amp 41 and five resistors 42, 43, 44, 45, 46. As the input/output terminals, a positive input Vin+ terminal 011, a negative input Vin− terminal 012, and an output terminal Vout 02, as well as a third reference voltage source 70 serving as an offset voltage, are provided.

The resistors 44 and 45 are connected in series between the Vin+ terminal 011 and the third reference voltage source 70, and the connection point between the resistors 44 and 45 is connected to the non-inverting input terminal (+ terminal) of the op-amp 41.

The resistors 42, 43, 46 are connected in series between the Vin− terminal 012 and the output terminal 41b of the op-amp 41. The connection point between the resistors 42 and 43 is connected to the inverting input terminal (+ terminal) of the op-amp 41, and the connection point 40c between the resistors 43 and 46 is connected to the Vout terminal 02.

The output voltage Vout of the signal amplification circuit 10c can be approximately determined using the equation below. If Vout is the voltage at the Vout terminal 02, Vin+ is the voltage at the Vin+ terminal 011, Vin− is the voltage at the Vin− terminal 012, R43 is the resistance value of the resistor 43, R42 is the resistance value of the resistor 42, and Vref3 is the voltage of the third reference voltage supply 70, then $$Vout = (Vin+ - Vin-) \times (R43/R42) + Vref3$$

In this signal amplification circuit 10c, the upper-limit saturation voltage and lower-limit saturation voltage of the output are determined by the upper- and lower-limit saturation voltages of the op-amp 41 and by the voltage drop occurring across the resistor 46. More specifically, the above-described two means depend on the following elements.

(Upper- and lower-limit saturation voltages of op-amp 41)

(1) Saturation voltage of transistors used in the output stage of the op-amp 41

(2) Impedance component of transistors used in the output stage of the op-amp 41

(Voltage drop occurring across the resistor 46)

(3) Resistance value of the resistor 46

(4) Current flowing in the resistor 46 (approximately equal to the load current flowing into/out of the Vout terminal 02)

FIG. 9 and FIG. 10 explain the lower-limit saturation voltage and upper-limit saturation voltage of the output. FIG. 9 and FIG. 10 use the same reference numerals as each other. Also, the same elements as in FIG. 8 are denoted by the same reference numerals as in FIG. 8.

In FIG. 9, Tr1 and Tr2 are transistors of the output stage 41a of an op-amp 41. The lower-limit saturation voltage of the output is the voltage resulting from adding to ground GND, that is 0 V, which is the source potential of the output-stage transistor Tr2 (a MOSFET) of the op-amp 41 of FIG. 9, (1) the voltage V5 of Tr2 which includes the on-stage voltage of the output-stage transistor Tr2 (MOSFET) of the op-amp 41 and the impedance of Tr2, occurring due to a sink current I03 in the op-amp 41, and (2) the voltage V6 occurring across the resistor 46 due to a current I7 flowing in from the load side; the resulting voltage is approximately 0.2 V.

On the other hand, in FIG. 10 the output upper-limit saturation voltage is the drain voltage of the transistor Tr1 (MOSFET), which is the power supply voltage VDD, that is, approximately 5 V, and so the voltage is the result of subtracting (1) the voltage V4 resulting by adding the on-state voltage of the transistor Tr1 (MOSFET) in which the source current I13 of the op-amp 41 occurs and the voltage due to the impedance of Tr1, and (2) the voltage V7 occurring across the resistor 46 due to a current I8 flowing out to the load side, and is approximately 4.8 V.

As explained above in FIGS. 8-10, in the case of a conventional signal amplification circuit 10c, elements determining the output saturation voltage depend on the characteristics of the transistors Tr1 and Tr2 comprised by the op-amp 41 and the resistance value of the resistor 46. For example, if the resistance value of the resistor 46 and the voltages V4 and V5 of Tr1 and Tr2 are low, the lower-limit saturation voltage falls, and the upper-limit saturation voltage rises. Conversely, if these values are high the lower-limit saturation voltage rises and the upper-limit saturation voltage falls.

In this way, the lower-limit saturation voltage and upper-limit saturation voltage depend on the characteristics of the transistors Tr1, Tr2 comprised by the op-amp 41 and the value of the resistor 46, and so fluctuations in the lower-limit saturation voltage and upper-limit saturation voltage easily occur due to "manufacturing variance" during manufacturing and due to "temperature dependence" thereof, and it is difficult to suppress the variance in these saturation voltages. In FIG. 9 and FIG. 10, the current flowing in the resistor 46 includes the current I7 flowing in from the load side and the current I8 flowing out to the load side, indicated by dotted lines; but in the above explanation these have been omitted. Tr1 in FIG. 9 and FIG. 10 may also be a p-channel MOSFET.

The effect on the pressure sensor output characteristics of the above-described manufacturing variance and temperature dependence is explained, again using FIG. 7. In FIG. 7, the target pressure sensor output is represented by the solid line b. There is a saturation voltage region (a region in which the voltage is constant; the constant voltage is the saturation voltage) is outside the steady output region, and moreover inside the diagnostic region. Most of lower-limit saturation voltages are positioned within the range Va to Vb (Δ1), while most of upper-limit saturation voltages are positioned within the range Vc to Vd (Δ2).

In the steady output range, a voltage is output which is linear with respect to the pressure, and when the pressure sensor is in steady operation (when there is no breakage of wiring or similar), in a case in which some excessively high pressure (or excessively low pressure) acts, due to some case other than a malfunction, so as to fall outside the steady range, it is desirable that the pressure sensor continue operation. Hence it is desirable that the output of the signal amplification circuit 10c in FIG. 8 saturate in a voltage interval not reaching a diagnostic region, that is, in the range Va to Vb and the range Vc to Vd.

However, due to the effect of the above-described "manufacturing variance" and "temperature dependence", when the output voltage range of the signal amplification circuit 10c in FIG. 8 has become broad (does not readily reach saturation), the output voltage is as indicated by the dotted line a. The output characteristic of the dotted line a is such that the saturation voltage is positioned in a diagnostic region, so that even when the pressure sensor is in steady operation, cases occur in which the saturation voltage enters into a diagnostic region, and in this case the problem arises that the ECU misdiagnoses the situation as a "sensor malfunction".

Conversely, when the output voltage range of the signal amplification circuit 10c in FIG. 8 becomes narrow (saturation easily occurs), the shape is as indicated by the dotted line c, and saturation occurs in the region in which a voltage which is linear with respect to pressure should be output (the region close to Vb and Vc), and there is the problem that the original function of a pressure sensor cannot be performed.

One means to avoid the above problems is to provide a diagnostic region and a steady output range, taking into consideration the range of variation in the saturation voltage due to manufacturing variance and temperature dependence. That is, to broad intervals Va to Vb and Vc to Vd such that variation in the saturation voltage of the output characteristic can be absorbed.

However, the range of variation of saturation voltage for a conventional signal amplification circuit 10c (in FIG. 8) is too broad to be absorbed. As one example, the graph of FIG. 11 shows the manufacturing variation range and temperature dependence of the lower-limit saturation voltage in a signal amplification circuit 10c in an example of the prior art. The X axis indicates temperature (° C.), the Y axis indicates the lower-limit saturation voltage (V), MAX indicates values of lower-limit saturation voltage which are highest due to manufacturing variation, TYP indicates values of the lower-limit saturation voltage which are as per typical design, and MIN indicates values of the lower-limit saturation voltage which are lowest due to manufacturing variation.

From FIG. 11, it is seen that the lower-limit saturation voltage of the signal amplification circuit 10c in FIG. 8 has variation of approximately 70 mV due to temperature and approximately 70 mV due to manufacturing variation, for a total variation of approximately 140 mV. In this example, measurements are performed at a power supply voltage=5 V. That is, for a power supply voltage of 5 V a variation of 140 mV=2.8% variation range over the entire range, which is not a small value. Of course a similar variation range occurs for the upper-limit saturation voltage.

In order to decrease this large variation range, manufacturing variation in the characteristics (on-state voltage, impedance, and similar) of the transistors Tr1, Tr2 of the op-amp 41 and of the resistance value of the resistance 46 (in FIGS. 8-10) must be decreased. The manufacturing variation can be decreased through measures taken in pressure sensor characteristic selection and manufacturing methods, but increases in manufacturing costs result. On the other hand, temperature dependence is related to the temperature dependences specific to materials, and so is not easily reduced.

In order to resolve these problems, Japanese Patent Application Laid-open No. 2007-312368 and Japanese Patent Application Laid-open No. H7-209326 disclose signal amplification circuits which are not easily affected by manufacturing variation or temperature dependence of the components (transistors, resistors, and similar), and which have small variation of the saturation voltage, which is an output characteristic.

FIG. 12 shows the configuration of a signal amplification circuit disclosed in Japanese Patent Application Laid-open No. 2007-312368. The signal amplification circuit 10a comprises a negative feedback amplification circuit 40, a lower-limit voltage limiting circuit 20, and an upper-limit voltage limiting circuit 30; the negative feedback amplification circuit 40 comprises a differential amplification circuit 40a, and a resistor 46 and the differential amplification circuit 40a comprises a Vin+ terminal 011, a Vin− terminal 012, first to third reference voltage sources 50, 60, 70, an op-amp 41, and four resistors 42 to 45. The lower-limit voltage limiting circuit 20 comprises an op-amp 21 and a diode 22 for backflow prevention; the upper-limit voltage limiting circuit 30 comprises an op-amp 31 and a diode 32 for backflow prevention. The output terminal (Vout terminal 02) of the signal amplification circuit 10a is connected to the output terminal 40b of the negative feedback amplification circuit 40, and the output terminal 40b is connected to the connection point 40c of the resistor 43 and the resistor 46. In the figure, 41b is the output terminal of the op-amp 41; the output terminal 41b and one end of the resistor 46 are connected, and the other end of the resistor 46 is connected to the connection point 40c.

In the lower-limit voltage limiting circuit 20, the non-inverting input terminal (+ terminal) of the op-amp 21 is connected to the first reference voltage source 50, and the inverting input terminal (− terminal) of the op-amp 21 is connected to the Vout terminal 02. The output terminal of the op-amp 21 is connected to the anode terminal of the diode 22, and the cathode terminal of the diode 22 is connected to the Vout terminal 02.

And, in the upper-limit voltage limiting circuit 30, the non-inverting input terminal (+ terminal) of the op-amp 31 is connected to the second reference voltage source 60, and the inverting input terminal (− terminal) of the op-amp 31 is connected to the Vout terminal 02. The output terminal of the op-amp 31 is connected to the cathode terminal of the diode 32, and the anode terminal of the diode 32 is connected to the Vout terminal 02.

By means of this configuration, the effects of the manufacturing variation and temperature dependence of each component (transistors, resistors, and similar) are not easily felt, and variation in the saturation voltage, which is an output characteristic, is reduced.

FIG. 13 shows the configuration of a signal amplification circuit disclosed in Japanese Patent Application Laid-open No. H7-209326. In FIG. 13, the signal amplification circuit comprises bipolar transistors Q0-Q19, resistors R1-R15, a MOS transistor M1, a constant-current source I1 and a capacitor C1. A reference voltage is created by Q18, Q19, R13, R14, and R15; Q14 and Q15 are transistors used for voltage limiting, and the above-described reference voltage is input to the bases of Q14 and Q15.

In steady operation, Q14 and Q15 are turned off (non-conducting), and when the output of the op-amp falls below the Vbe (base voltage) of −Q14 at the voltage-dividing point of R14 and R15, Q14 transitions to the on state, current flows into the op-amp, and control is executed such that the voltage Vout does not fall below this.

On the other hand, when the output of the op-amp exceeds the Vbe of +Q14 at the voltage-dividing point of R13 and R14, Q15 transitions to the on state. Current is drawn from the op-amp, and control is executed such that the voltage Vout does not rise above this.

FIG. 14 shows the configuration of a signal amplification circuit 31 disclosed in Japanese Patent Application Laid-open No. 2005-328151. In FIG. 14, VDD and VSS indicate the high and low potential side of a power supply, respectively. In this configuration, even when no switching circuit or similar is provided in particular, when the output voltage Vout is higher than a lower-limit limiting voltage VL, operation of the op-amp 16 becomes dominant, and inverted amplification can be performed without impeding operation of the op-amp 17.

On the other hand, it is stated that when the output voltage Vout is lower than the lower-limit limiting voltage VL, operation of the op-amp 17 becomes dominant, and precise lower-limit clamping operation can be performed without impeding operation of the op-amp 16.

Similarly, the op-amp 16 and the op-amp 27 are configured as negative feedback circuits, which take as inputs to the inverting input terminals the output voltage Vout so as to perform a higher-limit clamping operation with a higher-limit limiting voltage VH. The phase compensation circuits 22, 25, 30 of the op-amps 16, 17, 27 are connected to the output terminal Vout.

In the method disclosed in Japanese Patent Application Laid-open No. 2007-312368 as shown in FIG. 12, a source current flowing from the lower-limit voltage limiting circuit 20 to the negative feedback amplification circuit 40 when fixing (clamping) the output voltage. And, a sink current drawn from the negative feedback amplification circuit 40 to the upper-limit voltage limiting circuit 30 is necessary.

Further, in the method disclosed in Japanese Patent Application Laid-open No. H7-209326 as shown in FIG. 13, at the time of clamping operation is performed to either pass current to or draw current from the op-amp, and the current consumption is increased due to clamping.

That is, in the methods disclosed in Japanese Patent Application Laid-open No. 2007-312368 and Japanese Patent Application Laid-open No. H7-209326, when it is necessary to increase the sink/source capacity of the negative feedback amplification circuit, for example in low-resistance load driving or similar, the current consumption increases dramatically. And when the value of the upper-limit limiting voltage is low and the value of the lower-limit limiting voltage is high, current consumption increases dramatically.

In the method disclosed in Japanese Patent Application Laid-open No. 2005-328151 as shown in FIG. 14, it is stated that an unstable state due to collision between operation of the op-amp 16 and the op-amp 17 does not occur; but in actuality, collision occurs due to operation of the op-amp 16 and the op-amp 17, and there is a strong possibility that the op-amps may enter an unstable state. This is explained using FIG. 14 and FIG. 15.

For example, in FIG. 14, with approximately the timing at which the output voltage Vout passes the lower-limit limiting voltage VL or other voltage for clamping, there is transient repetition of (1) overshooting of the voltage falling, due to the response speeds of the op-amps 16 and 17, (2) consequent voltage rising due to the feedback II, (3) overshooting of the voltage rising, due to the response speeds of the op-amps 16 and 17, (4) consequent voltage falling due to the feedback I, and (5) a return to (1), so that the voltage oscillates.

In this transient region, the op-amp 16 and op-amp 17 are both in an active state, and a collision state occurs. When the response speeds of the op-amp 16 and the op-amp 17 are about the same, oscillation continues near the lower-limit limiting voltage VL, as shown in FIG. 15, and operation of the op-amps 16, 17 becomes unstable.

In this transient state, given the circuit configuration of FIG. 14, the following problem arises. The op-amp 16 and op-amp 17 both have output Vout connected to the phase compensation circuit 22 and phase compensation circuit 25, to perform phase compensation of the output Vout. In this case, the optimum phase compensation values differ in the transient region in which feedback I shown in FIG. 15 dominates and in the transient region in which feedback II dominates. Specifically, when performing phase compensation of op-amp 17, the current flowing in N8 must also be taken into consideration, but the current flowing in N8 cannot be controlled solely by the op-amp 17, but also depends on the state of N4 controlled by the op-amp 16. That is, the optimum phase compensation value for op-amp 17 changes with the state of op-amp 16, and consequently calculation of the values of the resistors and capacitors in the phase compensation circuit 25 becomes extremely complex. Also, for similar reasons, due to the effect of N4 on the op-amp 17, calculation of the values of the resistors and capacitors in the phase compensation circuit 22 for op-amp 16 becomes extremely complex.

The above are details of the collision state; due to this complexity, in the actual circuits unstable time periods tend to occur. Further, when performing phase compensation of the op-amp 17, current flowing in N8 that affects the op-amp 16 must also be considered, and calculation of the values of the resistors and capacitor of the phase compensation circuit 25 becomes complex.

SUMMARY OF THE INVENTION

This invention has as an object the resolution of these problems, to provide a low-current consumption type signal amplification circuit, with stable op-amp operation, and in which there are no large increases in current consumption due to the sink/source capacity of a negative feedback amplification circuit or the values of an upper-limit limiting voltage or lower-limit limiting voltage.

In order to attain this object, according to a first aspect of the present invention there is provided a signal amplification circuit, comprising a negative feedback amplification circuit, first and second voltage limiting circuits which limit the output voltage of the negative feedback amplification circuit, a first reference voltage source which applies a first reference voltage to the first voltage limiting circuit, and a second reference voltage source which applies a second reference voltage to the second voltage limiting circuit, the first voltage limiting circuit increasing a resistance value between an output terminal of the negative feedback amplification circuit and a ground terminal when the output voltage of the negative feedback amplification circuit falls below the first reference voltage, to fix a lower-limit saturation voltage of the negative feedback amplification circuit at the first reference voltage, and the second voltage limiting circuit increasing a resistance value between the output terminal of the negative feedback amplification circuit and a voltage source terminal when the output voltage of the negative feedback amplification circuit rises above the second reference voltage, to fix an upper-limit saturation voltage of the negative feedback amplification circuit at the second reference voltage, wherein the negative feedback amplification circuit has a first PMOS transistor connected between a high-potential side of a power supply of the negative feedback amplification circuit and the output terminal of the negative feedback amplification circuit, and a first NMOS transistor connected between a low-potential side of the power supply of the negative feedback amplification circuit and the output terminal of the negative feedback amplification circuit, and the first PMOS transistor and the first NMOS transistor form an output stage of the negative feedback amplification circuit, the first voltage limiting circuit has a first op-amp, and a second NMOS transistor connected between the low-potential side of the power supply of the negative feedback amplification circuit and the output terminal of the negative feedback amplification circuit, and series-connected with the first NMOS transistor, an inverting input terminal of the first op-amp is connected to the first reference voltage source, a non-inverting input terminal of the first op-amp is connected to the output terminal of the negative feedback amplification circuit, an output terminal of the first op-amp is connected to a gate terminal of the second NMOS transistor, the second voltage limiting circuit has a second op-amp, and a second PMOS transistor connected between the high-potential side of the power supply of the negative feedback amplification circuit and the output terminal of the negative feedback amplification circuit, and series- connected with the first PMOS transistor, an inverting input terminal of the second op-amp is connected to the second reference voltage source, a non-inverting input terminal of the second op-amp is connected to the output terminal of the negative feedback amplification circuit, and an output terminal of the second op-amp is connected to a gate terminal of the second PMOS transistor.

Further, according to the first aspect of the present invention, the negative feedback amplification circuit has a third op-amp, four resistors which are first to fourth resistors, a positive input terminal, a negative input terminal, an output terminal, and a third reference voltage source, one end of the first resistor is connected to the negative input terminal, and the other end is connected to one end of the second resistor, one end of the third resistor is connected to the positive input terminal, and the other end is connected to one end of the fourth resistor, a connection point between the first resistor and the second resistor is connected to an inverting input terminal of the third op-amp, a connection point between the third resistor and the fourth resistor is connected to a non-inverting input terminal of the third op-amp, the other end of the second resistor is connected to the output terminal of the negative feedback amplification circuit, and the other end of the fourth resistor is connected to the third reference voltage source.

Further, according to a second aspect of the present invention, there is provided a signal amplification circuit, comprising a negative feedback amplification circuit, first and second voltage limiting circuits which limit the output voltage of the negative feedback amplification circuit, a first reference voltage source which applies a first reference voltage to the first voltage limiting circuit, and a second reference voltage source which applies a second reference voltage to the second voltage limiting circuit, the first voltage limiting circuit increasing a resistance value between an output terminal of the negative feedback amplification circuit and a ground terminal when the output voltage of the negative feedback amplification circuit falls below the first reference voltage, to fix a lower-limit saturation voltage of the negative feedback amplification circuit at the first reference voltage, and the second voltage limiting circuit increasing a resistance value between the output terminal of the negative feedback amplification circuit and a voltage source terminal when the output voltage of the negative feedback amplification circuit rises above the second reference voltage, to fix an upper-limit saturation voltage of the negative feedback amplification circuit at the second reference voltage, wherein the negative feedback amplification circuit has a first PMOS transistor connected between a high-potential side of a power supply of the negative feedback amplification circuit and the output terminal of the negative feedback amplification circuit, and a first NMOS transistor connected between a low-potential side of the power supply of the negative feedback amplification circuit and the output terminal of the negative feedback amplification circuit, and the first PMOS transistor and the first NMOS transistor form an output stage of the negative feedback amplification circuit, the first voltage limiting circuit has a first op-amp, a second NMOS transistor connected between the low-potential side of the power supply of the negative feedback amplification circuit and the output terminal of the negative feedback amplification circuit, and series-connected with the first NMOS transistor, a first resistor, and a second resistor, the first resistor and the second resistor are series-connected, and are provided between the high-potential side of the power supply of the negative feedback amplification circuit and the output terminal of the negative feedback amplification circuit, an inverting input terminal of the first op-amp is connected to the first reference voltage source, a non-inverting input terminal of the first op-amp is connected to a connection point between the first resistor and the second resistor, an output terminal of the first op-amp is connected to a gate terminal of the second NMOS transistor, the second voltage limiting circuit has a second op-amp, a second PMOS transistor connected between the high-potential side of the power supply of the negative feedback amplification circuit and the output terminal of the negative feedback amplification circuit and series-connected with the first PMOS transistor, a third resistor, and a fourth resistor, the third resistor and the fourth resistor are series-connected and are provided between the low-potential side of the power supply of the negative feedback amplification circuit and the output terminal of the negative feedback amplification circuit, an inverting input terminal of the second op-amp is connected to the second reference voltage source, a non-inverting input terminal of the second op-amp is connected to a connection point between the third resistor and the fourth resistor, and an output terminal of the second op-amp is connected to a gate terminal of the second PMOS transistor.

Further, according to the first and second aspects of the present invention, the second NMOS transistor is connected between the first NMOS transistor and the output terminal of the negative feedback amplification circuit, and the second PMOS transistor is connected between the first PMOS transistor and the output terminal of the negative feedback amplification circuit.

Further, according to the second aspect of the present invention, the negative feedback amplification circuit has a third op-amp, four resistors which are fifth to eighth resistors, a positive input terminal, a negative input terminal, an output terminal, and a third reference voltage source, one end of the fifth resistor is connected to the negative input terminal, and the other end is connected to one end of the sixth resistor, one end of the seventh resistor is connected to the positive input terminal, and the other end is connected to one end of the eighth resistor, a connection point between the fifth resistor and the sixth resistor is connected to an inverting input terminal of the third op-amp, a connection point between the seventh resistor and the eighth resistor is connected to a non-inverting input terminal of the third op-amp, the other end of the sixth resistor is connected to the output terminal of the negative feedback amplification circuit, and the other end of the eighth resistor is connected to the third reference voltage source.

Further, the a signal amplification circuit according to the first and second aspects of the present invention, comprises: a first phase compensation capacitor, connected between the output terminal of the first op-amp and the output of a differential input portion of the first op-amp; a second phase compensation capacitor, connected between the output terminal of the second op-amp and the output of a differential input portion of the second op-amp; and a third phase compensation capacitor, connected between the output terminal of the negative feedback amplification circuit and the output of a differential input portion of the negative feedback amplification circuit.

In accordance with a third aspect of the present invention, there is provided a signal amplification circuit, comprising a negative feedback amplification circuit, a lower-limit voltage limiting circuit which limits the output voltage of the negative feedback amplification circuit, and a first reference voltage source which applies a first reference voltage to the lower-limit voltage limiting circuit, the lower-limit voltage limiting circuit increasing a resistance value between an output terminal of the negative feedback amplification circuit and a ground terminal when the output voltage of the negative feedback amplification circuit falls below the first reference voltage, to fix a lower-limit saturation voltage of the negative feedback amplification circuit at the first reference voltage, wherein the negative feedback amplification circuit has a first PMOS transistor connected between a high-potential side of a power supply of the negative feedback amplification circuit and the output terminal of the negative feedback amplification circuit, and a first NMOS transistor connected between a low-potential side of the power supply of the negative feedback amplification circuit and the output terminal of the negative feedback amplification circuit, and the first PMOS transistor and the first NMOS transistor form an output stage of the negative feedback amplification circuit, the lower-limit voltage limiting circuit has a first op-amp, and a second NMOS transistor connected between the low-potential side of the power supply of the negative feedback amplification circuit and the output terminal of the negative feedback amplification circuit and series-connected with the first NMOS transistor, an inverting input terminal of the first op-amp is connected to the first reference voltage source, a non-inverting input terminal of the first op-amp is connected to the output terminal of the negative feedback amplification circuit, and an output terminal of the first op-amp is connected to a gate terminal of the second NMOS transistor.

According to the third aspect of the present invention, the second NMOS transistor is connected between the first NMOS transistor and the output terminal of the negative feedback amplification circuit.

In accordance with a fourth aspect of the present invention, there is provided a signal amplification circuit, comprising a negative feedback amplification circuit, an upper-limit voltage limiting circuit which limits the output voltage of the negative feedback amplification circuit, and a first reference voltage source which applies a first reference voltage to the upper-limit voltage limiting circuit, the upper-limit voltage limiting circuit increasing a resistance value between an output terminal of the negative feedback amplification circuit and a voltage source terminal when the output voltage of the negative feedback amplification circuit rises above the first reference voltage, to fix an upper-limit saturation voltage of the negative feedback amplification circuit at the first reference voltage, wherein the negative feedback amplification circuit has a first PMOS transistor connected between a high-potential side of a power supply of the negative feedback amplification circuit and the output terminal of the negative feedback amplification circuit, and a first NMOS transistor connected between a low-potential side of the power supply of the negative feedback amplification circuit and the output terminal of the negative feedback amplification circuit, and the first PMOS transistor and the first NMOS transistor form an output stage of the negative feedback amplification circuit, the upper-limit voltage limiting circuit has a first op-amp, and a second PMOS transistor connected between the high-potential side of the power supply of the negative feedback amplification circuit and the output terminal of the negative feedback amplification circuit and series-connected with the first PMOS transistor, an inverting input terminal of the first op-amp is connected to the first reference voltage source, a non-inverting input terminal of the first op-amp is connected to the output terminal of the negative feedback amplification circuit, and an output terminal of the first op-amp is connected to a gate terminal of the second PMOS transistor.

According to the fourth aspect of the present invention, the second PMOS transistor is connected between the first PMOS transistor and the output terminal of the negative feedback amplification circuit.

The signal amplification circuit according to the third and fourth aspects of the invention further includes: a first phase compensation capacitor, connected between the output terminal of the first op-amp and the output of a differential input portion of the first op-amp; and a second phase compensation capacitor, connected between the output terminal of the negative feedback amplification circuit and the output of a differential input portion of the negative feedback amplification circuit.

The signal amplification circuit according to the third and fourth aspects of the invention further includes a resistor between the non-inverting input terminal of the first op-amp and the output terminal of the negative feedback amplification circuit.

By means of this invention, by controlling the on-state resistances of MOSFETs (M16, M17 in FIGS. 1 and 5) forming an upper-limit voltage limiting circuit, lower-limit voltage limiting circuit, and negative feedback amplification circuit, there is no increase in current when performing clamping operation, so that current consumption of the signal amplification circuit can be made small.

Further, when increasing the sink/source capacity of the negative feedback amplification circuit, it is sufficient to change only the on-state resistances of MOSFETs (M16, M17 in FIGS. 1 and 5), so that current consumption need not be increased. And, even when changing the upper-limit limiting voltage/lower-limit limiting voltage, it is sufficient to change only the reference voltages (Vref1, Vref2 in FIGS. 1 and 5), and in this case also there is no need to increase current consumption.

Also, phase compensation capacitors are incorporated within the op-amps 221 and 231 in FIGS. 1 and 5, and there is no connection with the output (Vout) (because operation is completed within the op-amps), so that op-amps can be operated with stability.

From the above, a low current consumption type signal amplification circuit capable of stable operation can be provided.

DESCRIPTION OF THE PREFERRED EMBODIMENTS

Below, the above aspects of the invention are explained using particular exemplary embodiments.

Embodiment 1

Figure 1:
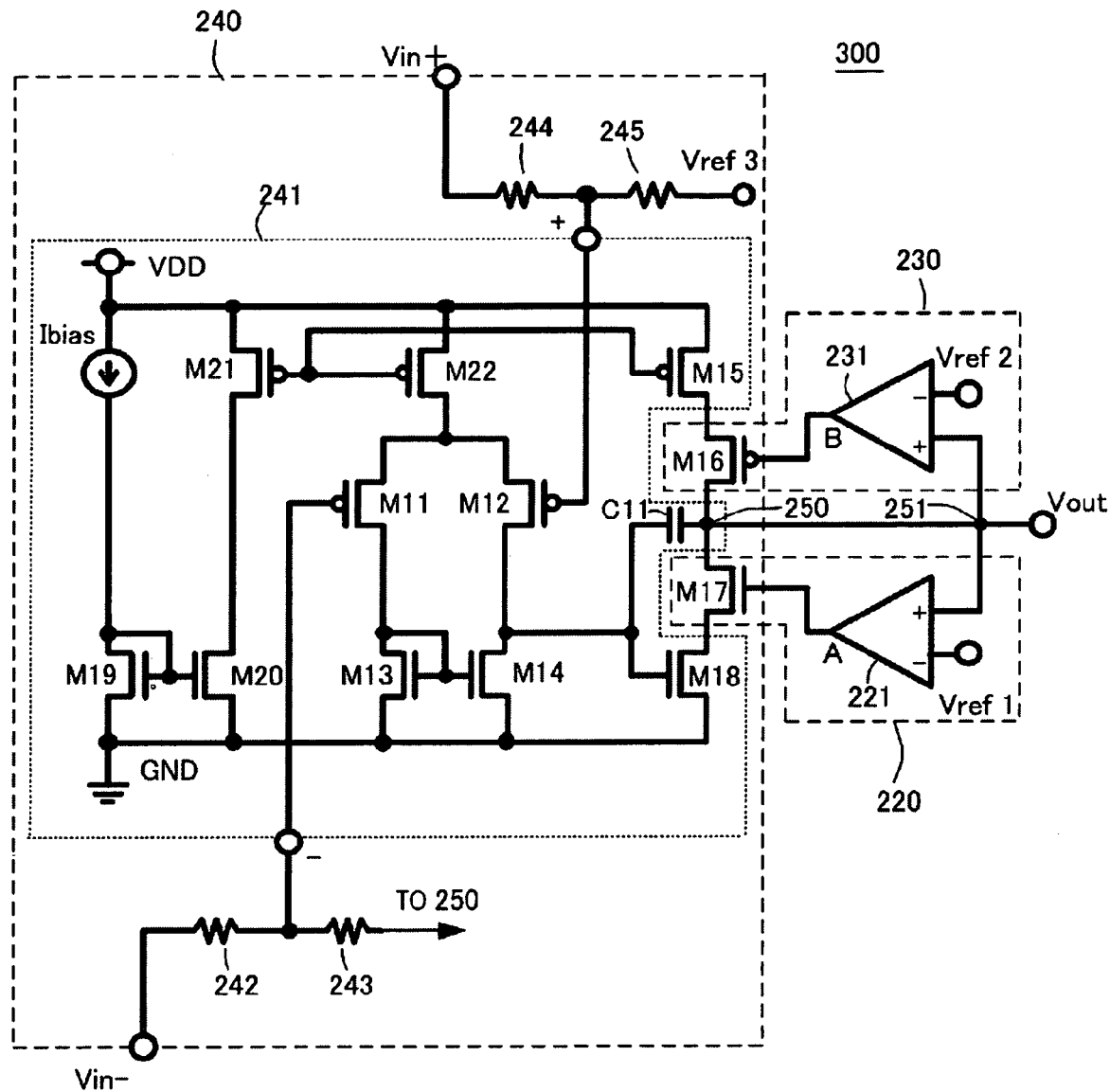
FIG. 1 is a circuit diagram of principal portions of the signal amplification circuit of a first embodiment of the invention.

FIG. 1 is a circuit diagram of principal portions of the signal amplification circuit of a first embodiment of the invention. Below, the circuit configuration is explained.

The signal amplification circuit 300 comprises a negative feedback amplification circuit 240, upper-limit voltage limiting circuit 230, and lower-limit voltage limiting circuit 220. The negative feedback amplification circuit 240 comprises an op-amp 241 and resistors 242, 243, 244, 245; the resistor 242 is connected to the Vin− terminal (negative input terminal), the resistor 244 is connected to the Vin+ terminal (positive input terminal), and the resistor 245 is connected to a third reference voltage Vref3. The upper-limit voltage limiting circuit 230 and lower-limit voltage limiting circuit 220 are respectively a second voltage limiting circuit and a first voltage limiting circuit.

The upper-limit voltage limiting circuit 230 comprises an op-amp 231 and M16; the lower-limit voltage limiting circuit 220 comprises an op-amp 221 and M17. The output terminal Vout of the op-amp 241 (negative feedback amplification circuit 240) is connected to the connection point 250 of M16 and M17, to the + terminal (non-inverting input terminal) of the op-amp 231, and to the + terminal (non-inverting input terminal) of the op-amp 221. One terminal (the inverting input terminal) of the op-amp 231 and the second reference voltage Vref2 are connected, and one terminal (the inverting input terminal) of the op-amp 221 and the first reference voltage Vref1 are connected. The output terminal of the op-amp 231 is connected to the gate terminal of M16, and the output terminal of the op-amp 221 is connected to the gate terminal of M17.

Here, M16 and M17 are directly connected, but a configuration may be employed in which M15 and M18 are directly connected, M16 is connected between M15 and VDD, and M17 is connected between M18 and GND. However, a configuration in which M16 and M17 are directly connected as in FIG. 1 enables higher precision in the region in which voltage limiting is not performed (steady output range), and is more preferable.

Figure 13:
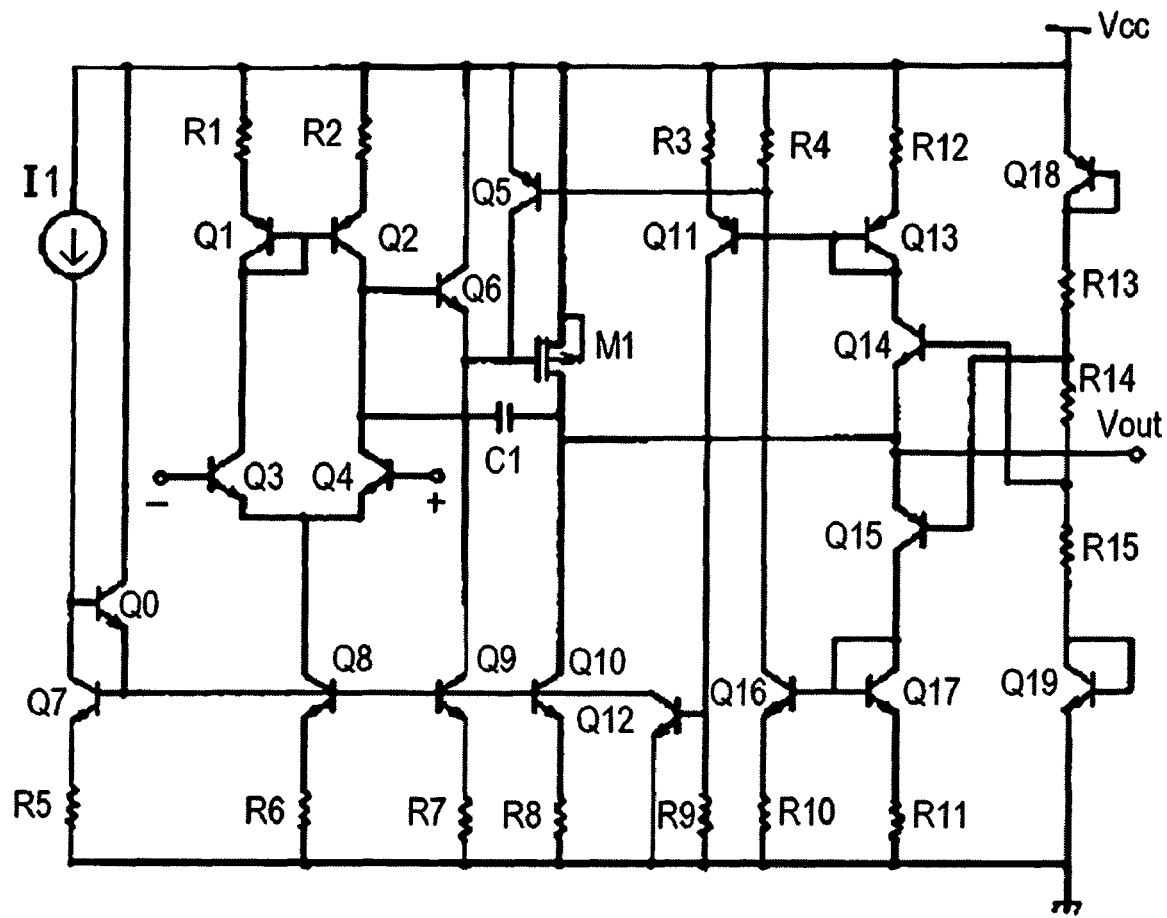
FIG. 13 is a circuit diagram of principal portions of another signal amplification circuit of the prior art.

As the first reference voltage Vref1, second reference voltage Vref2, and third reference voltage Vref3, the first reference voltage source, second reference voltage source, and third reference voltage source shown in FIG. 13 can be used. The reference voltage sources comprise voltage selection means for selecting one type of voltage from among two or more voltage types generated from resistive voltage division.

As such voltage selection means, a method employing a multiplexer, a method in which a prescribed photomask is selected to form metal wiring connecting prescribed voltage-dividing resistances to select a prescribed reference voltage, and a method in which a laser or current is used to generate heat to break metal wiring connecting unnecessary voltage-dividing resistances, leaving only metal wiring connected prescribed voltage-dividing resistances to select a prescribed reference voltage, may be used. With respect to these voltage selection means, the means described in Japanese Patent Application Laid-open No. 2007-312368 can be used.

The op-amp 241 comprises Ibias (a constant-current source), M11, M12, M13, M14, M15, M18, M19, M20, M21, M22, and a phase compensation capacitor C11. Ibias, M21, M22, and M15 are each connected to VDD, which is the high-potential side of the power supply of the negative feedback amplification circuit, and M19, M20, M13, M14, and M18 are each connected to GND, which is the low-potential side of the power supply of the negative feedback amplification circuit; C11 is connected between the connection point 250 and the output of the differential input portion (M11, M12, M13, M14). Normally, M15 and M18, which form the output stage of the negative feedback amplification circuit, are connected to the connection point 250, but are separated in the op-amp 241 of this invention, in a configuration in which M15 and M16 are connected, M18 and M17 are connected, and M16 and M17 are each connected to the connection point 250 to form the negative feedback amplification circuit 240.

M16 and M17 are constituent elements of the negative feedback amplification circuit 240, and at the same time are constituent elements of the upper-limit voltage limiting circuit 230 and the lower-limit voltage limiting circuit 220.

Next, circuit operation is explained. In steady operation, when Vout>Vref1 and moreover Vout<Vref2, the output of the op-amp 231 is low, and M16 is in the on state. Also, the output of the op-amp 221 is high, and M17 is in the on state. Because both M16 and M17 are in the on state, M15 and M18, comprised by the op-amp 241, are short-circuited through the connection point 250, and normal op-amp operation can be performed.

Next, when Vout≧Vref2, upper-limit voltage limiting operation occurs. At this time, the output of the op-amp 231 transitions from the low to the high state. M16 transitions to the off state, and the on-state resistance of M16 rises. Hence the voltage drop occurring at M16 increases, and rising of the Vout voltage to Vref2 or above is prevented.

Next, when Vout≦Vref1, lower-limit voltage limiting operation occurs. At this time, the output of the op-amp 221 transitions from the high to the low state. M17 transitions to the off state, and the on-state resistance of M17 rises. Hence the voltage drop across M17 increases, and falling of the Vout voltage to Vref1 or below is prevented.

As explained above, the on-state resistance of M16 and M17 is used to control clamping operation, so that there is no increase in current due to clamping operation. Hence current consumption of this signal amplification circuit 300 is small. Also, when the sink/source capacity of the negative feedback amplification circuit 240 (op-amp 241) is increased, only the on-state resistances of M16 and M17 need be changed, and there is no need to increase current consumption as in the prior art.

Moreover, even when the upper-limit limiting voltage or the lower-limit limiting voltage is changed, it is sufficient to change only the values of Vref1 and Vref2, and in this case also no increase in current consumption occurs.

Below, current consumption is explained for the conventional configuration of FIG. 12 and for the configuration of FIG. 1.

The upper-limit saturation voltage and lower-limit saturation voltage for both are assumed to be 4.9 V and 0.1 V respectively. Hence, in FIG. 12 the first reference voltage source 50 and first reference voltage Vref1 are 0.1 V, and the second reference voltage source 60 and second reference voltage Vref2 are 4.9 V. The high-potential side (VDD, not shown in FIG. 12) of the power supply for the op-amps 41, 21, 31, 241, 221, 231 is 5 V, and the low-potential side is GND (not shown in FIG. 12). The resistance 46 is 10Ω. Circuit constant values are set in explanations such that the lower-limit saturation voltage of the op-amps 41, 21, 31, 241, 221, 231 is 0.05 V, and the upper-limit saturation voltage of the op-amps 41, 21, 31, 241, 221, 231 is 4.95 V.

Figure 12:
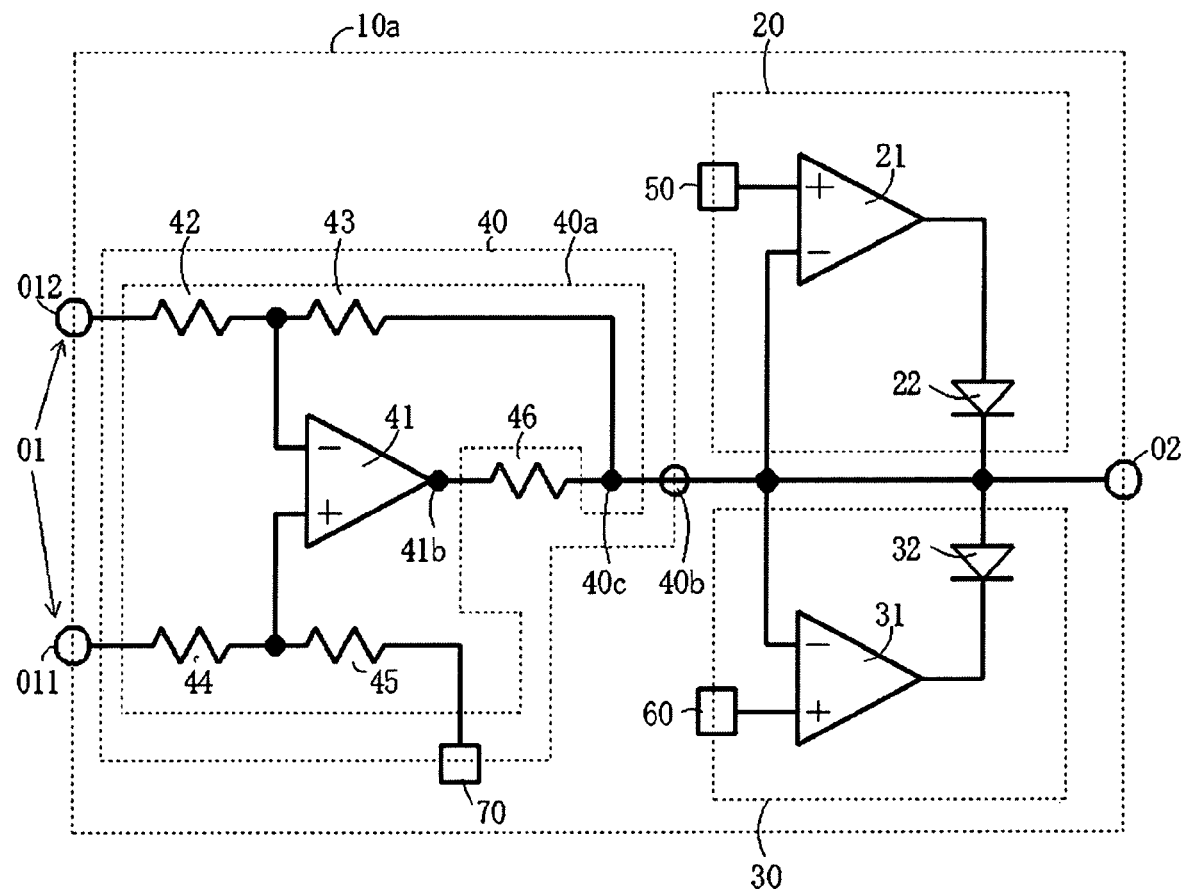
FIG. 12 is a circuit diagram of principal portions of a signal amplification circuit of the prior art.

The largest factor causing a difference in current consumption of the signal amplification circuit 10a of FIG. 12 and the signal amplification circuit 300 of FIG. 1 is the difference in the current driving capacities of the op-amps 21, 31, 221, 231 within the upper-limit voltage limiting circuit and the lower-limit voltage limiting circuit.

In the signal amplification circuit shown in FIG. 12, the lower-limit voltage limiting circuit 20 limits the lower-limit voltage by passing a current from the power supply (VDD) of the op-amp 21 to GND via the PMOS transistor forming the output stage of the op-amp 21, diode 22, and resistor 46 and via the NMOS transistor forming the output stage of the op-amp 41, when the output of the negative feedback amplification circuit 40 falls to less than 0.1 V.

Here, the current flowing may be calculated as (Vref1−lower-limit saturation voltage of op-amp 41)/
resistance 46=(0.1 V−0.05 V)/10Ω=5 mA Hence it is seen that the op-amp 21 must be provided with 5 mA or more of current driving capacity (source current capacity).

Also, in the signal amplification circuit shown in FIG. 12, when the output of the negative feedback amplification circuit 40 exceeds 4.9 V, the upper-limit voltage limiting circuit 30 limits the upper-limit voltage by passing a current from the power supply (VDD, not shown in FIG. 12) of the op-amp 41 to GND (not shown in FIG. 12) via the PMOS transistor forming the output stage of the op-amp 41, resistor 46, diode 32, and NMOS transistor forming the output stage of the op-amp 31.

Similarly, the current when the upper-limit voltage is limited may be calculated as (upper-limit saturation voltage of op-amp 41−Vref2)/
resistance 46=(4.95 V−4.9 V)/10Ω=5 mA Hence it is seen that the op-amp 31 must be provided with 5 mA or more of current driving capacity (sink current capacity).

As explained above, in operation of the signal amplification circuit shown in FIG. 12, considerable current driving capacity is necessary for the op-amp 21 and the op-amp 31, and this is accompanied by an unavoidable increase in the current consumption of the op-amp 21 and op-amp 31. This gives rise to the problem of the difficulty in suppressing current consumption for the circuit as a whole.

On the other hand, in the configuration of this embodiment shown in FIG. 1, the outputs of the op-amp 221 of the lower-limit voltage limiting circuit 220 and of the op-amp 231 of the upper-limit voltage limiting circuit 230 are connected to the gates of the n-channel MOSFET M17 and the p-channel MOSFET M16 respectively, and by turning off M17 and M16, the upper-limit voltage and lower-limit voltage are limited; and the current driving capacities of the NMOS transistor M226 (in FIG. 2) of the output stage of the op-amp 221 and of the PMOS transistor M235 (in FIG. 3) of the output stage of the op-amp 231 can be made much smaller compared with the current driving capacities of the PMOS transistor of the op-amp 21 and the NMOS transistor of the op-amp 31 shown in FIG. 12.

For example, while values are not limited thereto, in this embodiment it has been confirmed that no problems arise if the driving capacities of the op-amp 221 and the op-amp 231 are suppressed to approximately 0.5 mA (1/10 or less than in FIG. 12).

Hence in the configuration of this embodiment in FIG. 1, current consumption of the op-amp 221 and the op-amp 231 can be suppressed, and there is the advantage that current consumption can be lowered for the circuit as a whole.

Figure 2:
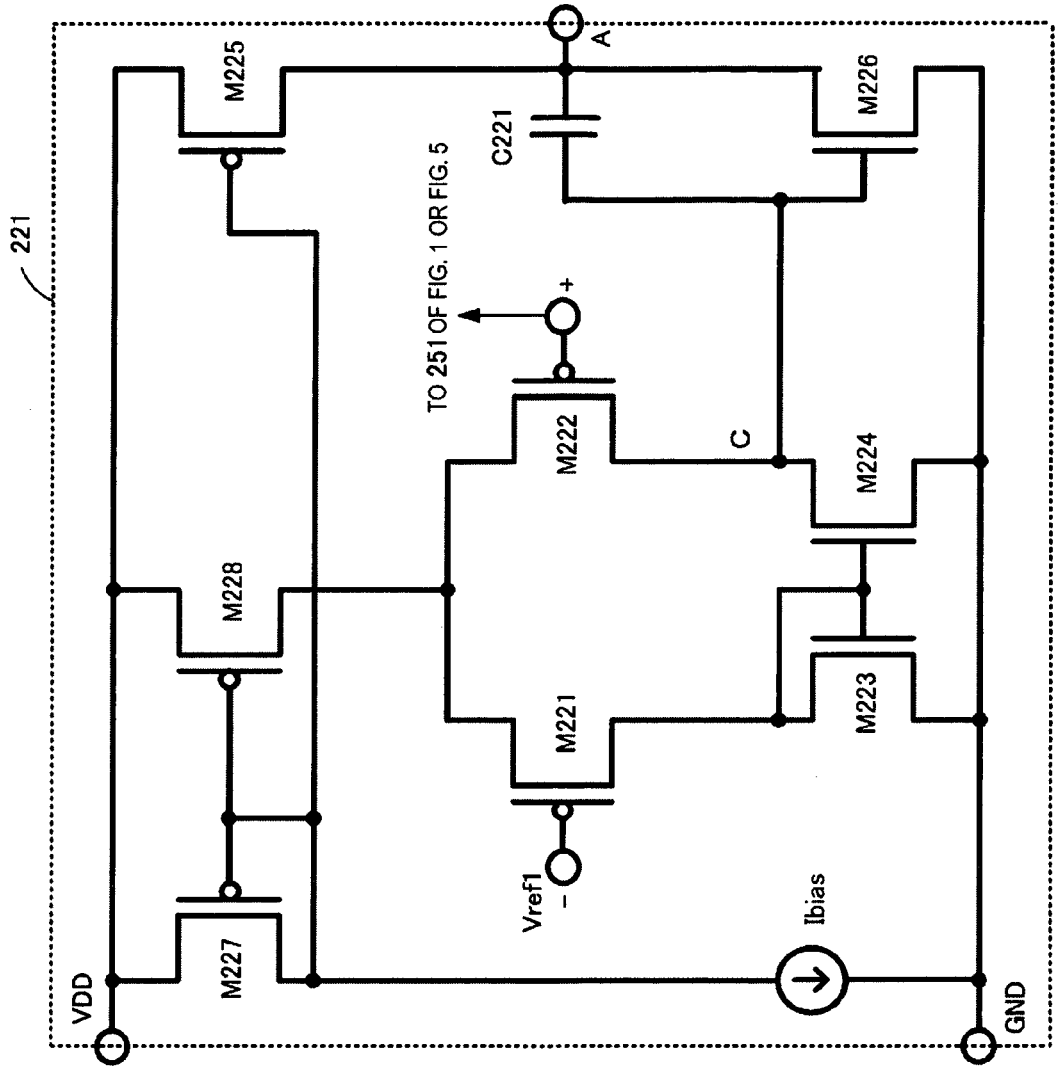
FIG. 2 is a detailed circuit diagram of the op-amp 221 of FIG. 1.

FIG. 2 is a detailed circuit diagram of the op-amp 221 shown in FIG. 1 and in FIG. 5 described below. The same elements as in FIG. 1 are denoted by the same reference numerals as in FIG. 1. M227, M228, M221, M222, and M225 are PMOS transistors, and M223, M224 and M226 are NMOS transistors. This op-amp 221 comprises a constant-current circuit (Ibias), a mirror circuit (M227, M228) which mirrors the current of this constant-current circuit, a differential input portion (M221, M222, M223, M224) connected to the mirror circuit, and an output stage (M225, M226) of the op-amp 221, to which the output of this differential input portion is connected. The output point C of the differential input portion and the gate of the lower side M226 forming the output stage are connected, and between the output point C of the differential input portion and the output terminal A (connection point of M225 and M226 forming the output stage) of the op-amp 221 is connected a phase compensation capacitor C221 of the op-amp 221. This phase compensation capacitor C221 is incorporated within the op-amp 221, and is connected between the output point C of the differential input portion and the output terminal A of the op-amp 221.

Figure 3:
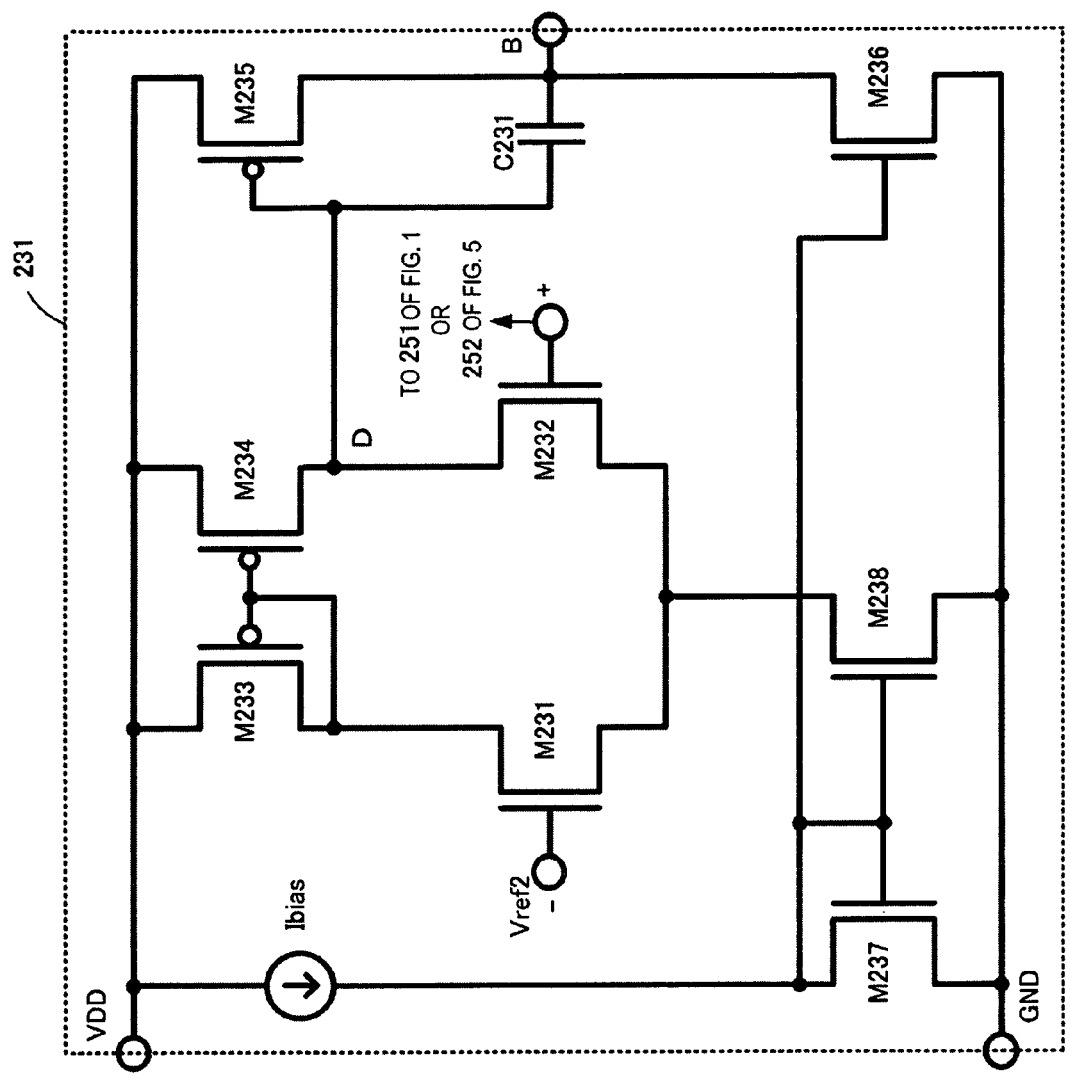
FIG. 3 is a detailed circuit diagram of the op-amp 231 of FIG. 1.

FIG. 3 is a detailed circuit diagram of the op-amp 231 shown in FIG. 1 and in FIG. 5 described below. The same elements as in FIG. 1 are denoted by the same reference numerals as in FIG. 1. M233, M234 and M235 are PMOS transistors, and M231, M232, M236, M237, and M238 are NMOS transistors. This op-amp 231 comprises a constant-current circuit (Ibias), a mirror circuit (M237, M238) which mirrors the current of this constant-current circuit, a differential input portion (M231, M232, M233, M234) connected to the mirror circuit, and an output stage (M235, M236) of the op-amp 231, to which the output of this differential input portion is connected. The output point D of the differential input portion and the gate of the upper side M235 forming the output stage are connected, and between the output point D of the differential input portion and the output terminal B (connection point of M235 and M236 forming the output stage) of the op-amp 231 is connected a phase compensation capacitor 0231 of the op-amp 231. This phase compensation capacitor C231 is incorporated within the op-amp 231, and is connected between the output point D of the differential input portion and the output terminal B of the op-amp 231.

Figure 14:
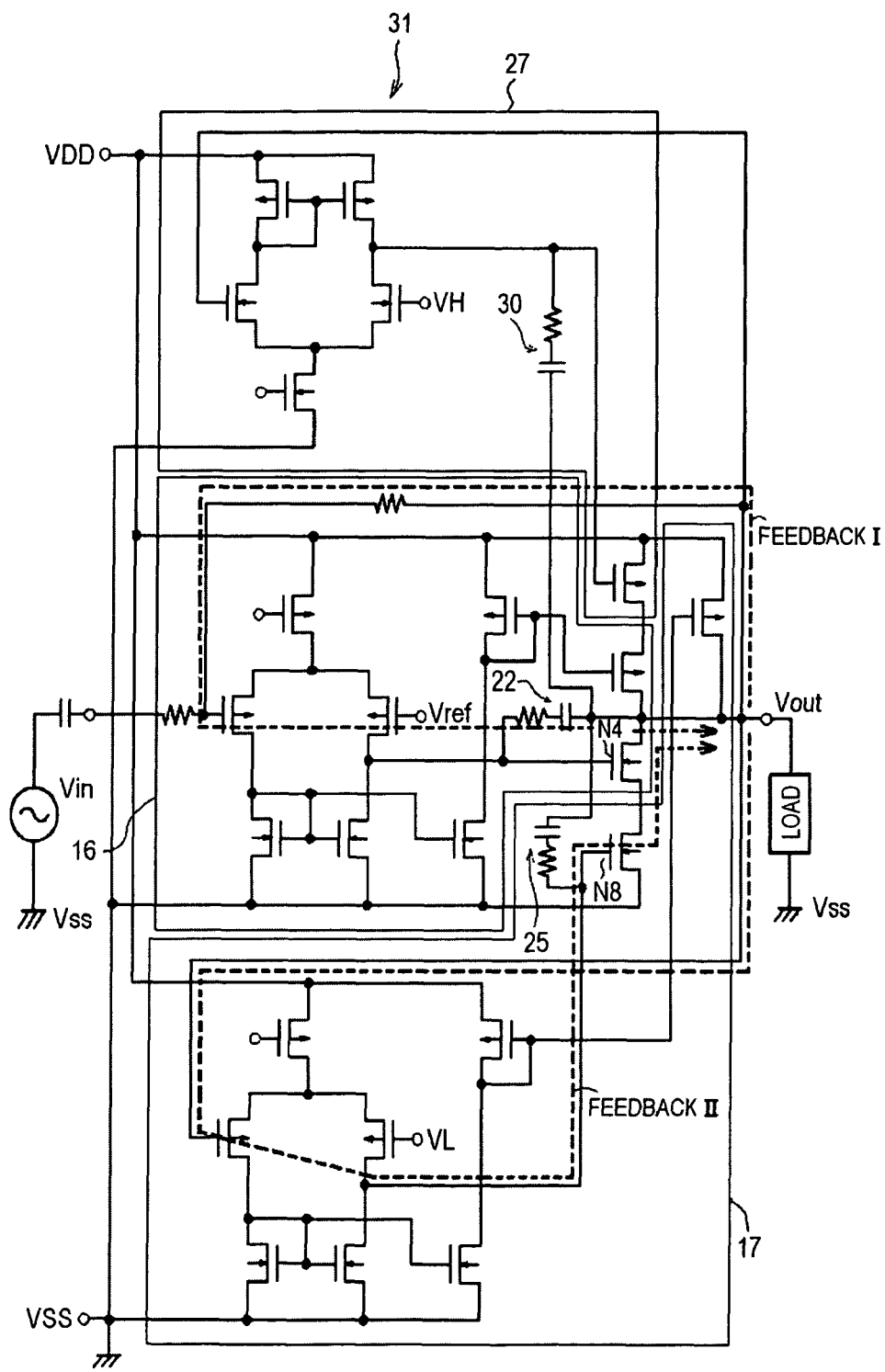
FIG. 14 is a circuit diagram of principal portions of still another signal amplification circuit of the prior art.

In this invention, different from the configuration of FIG. 14, the phase compensation capacitors C221 (in FIG. 2), C231 (in FIG. 3) incorporated within the op-amps 221, 231 are not connected to the output terminal Vout. Consequently the op-amps 221, 231 are independent and not directly affected by the output voltage Vout, op-amp operation is stable, and operation of the signal amplification circuit 300 (in FIG. 1) can be stabilized.

In calculating the optimum value for the phase compensation capacitor of the op-amp 221, the currents flowing in the NMOS transistors M224 and M226 (in FIG. 2), the MOS size, and the current flowing in the PMOS transistor M225 (in FIG. 2) are taken into consideration. That is, the op-amp 241, which is a negative feedback amplification circuit, is completely unrelated, and the decision can be made independently, considering only the op-amp 221.

Similarly when calculating the optimum value for the phase compensation capacitor of the op-amp 231, the currents flowing in the NMOS transistors M234 and M236 (in FIG. 3), the MOS size, and the current flowing in the PMOS transistor M235 (in FIG. 3) are taken into consideration, and similarly to the op-amp 221, the op-amp 241 is completely unrelated, and the decision can be made independently considering only the op-amp 231.

Figure 4:
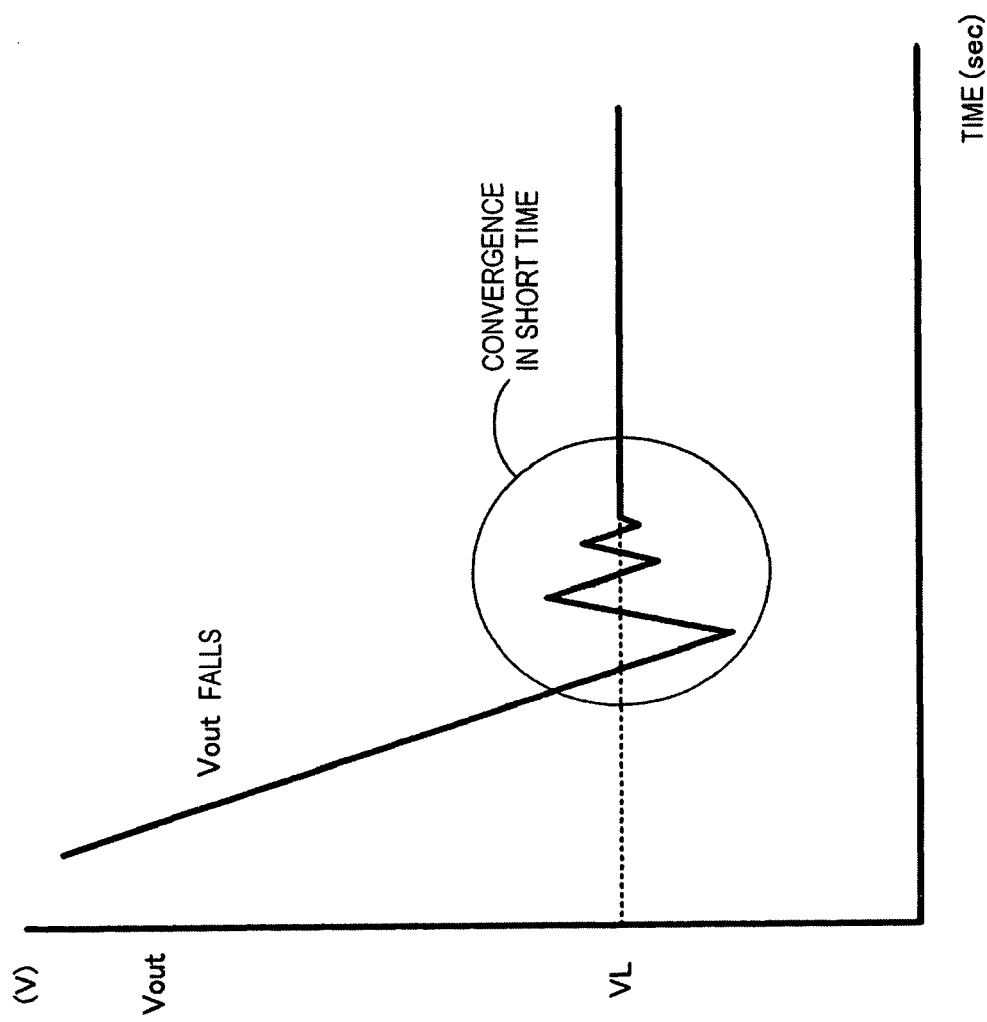
FIG. 4 is an oscillation waveform diagram of the output voltage Vout near the lower-limit limiting voltage VL.
Figure 15:
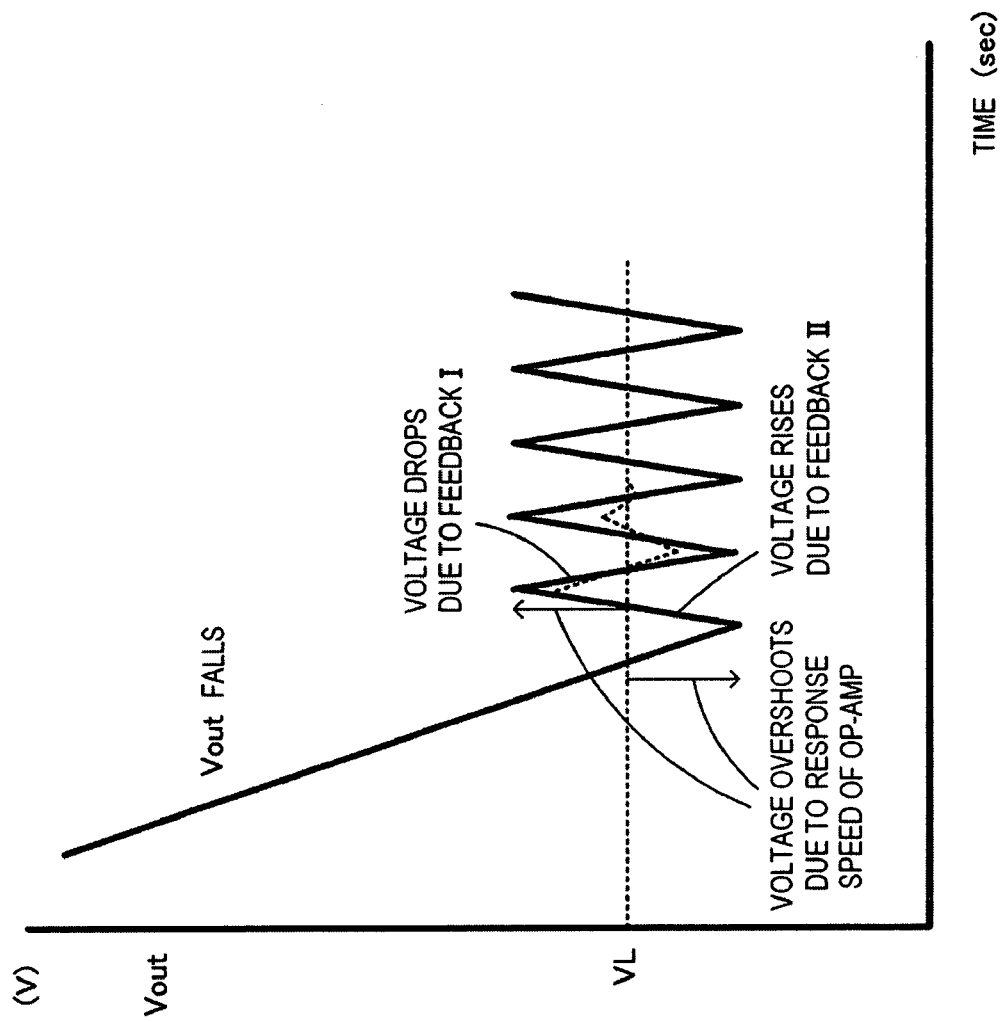
FIG. 15 is an oscillation waveform diagram of the output voltage Vout near VL in a signal amplification circuit of the prior art.

Further, in order to facilitate convergence of oscillations of the output voltage Vout near the lower-limit voltage limiting VL indicated by the dotted waveform in FIG. 15, it is effective to make the response speed of the op-amp 221 on the side halting the voltage approximately 50 times greater than the response speed of the op-amp 241 on the side on which the voltage is halted, to provide a speed difference between the op-amps. By providing a response speed for the op-amp 221 and the op-amp 231 which is approximately 50 times faster than the response speed for the op-amp 241, oscillation of the waveform of the output voltage Vout near the lower-limit voltage limiting VL can be made to converge in a short time as shown in FIG. 4. And although not shown, by setting the response speed of the op-amp 231 to be approximately 50 times faster than the response speed of the op-amp 241, oscillation of the waveform of the output voltage Vout near the upper-limit voltage limiting VH can also be made to converge in a short time.

In the configuration shown in FIG. 14 also, in cases in which the lower-limit voltage is limited, it is conceivable that by raising the response speed of the op-amp 17 with respect to the response speed of the op-amp 16, oscillations in the output voltage can be made to converge in a short time; but in order to raise the response speed, the current must be increased at different places within the op-amp. However, as explained above, because the phase compensation circuits used in the op-amp 16 and the op-amp 17 affect each other, the greater the difference in response speeds between the op-amp 16 and the op-amp 17 is made, the smaller is the possibility of performing optimal phase compensation. Hence the problem of a design trade-off between a difference in response speeds and phase compensation is made evident, and circuit modification is not easily accomplished.

The op-amp 221 and op-amp 231 are both configured as positive-feedback circuits, with the output voltage Vout input to the non-inverting input terminal. By configuring positive-feedback circuits, the op-amp 221 and op-amp 231 can be separated and made independent from the op-amp 241, so that there is no longer a need to perform phase compensation of the output voltage Vout, and phase compensation can be completed within the respective op-amp 221 and op-amp 231.

Embodiment 2

Figure 5:
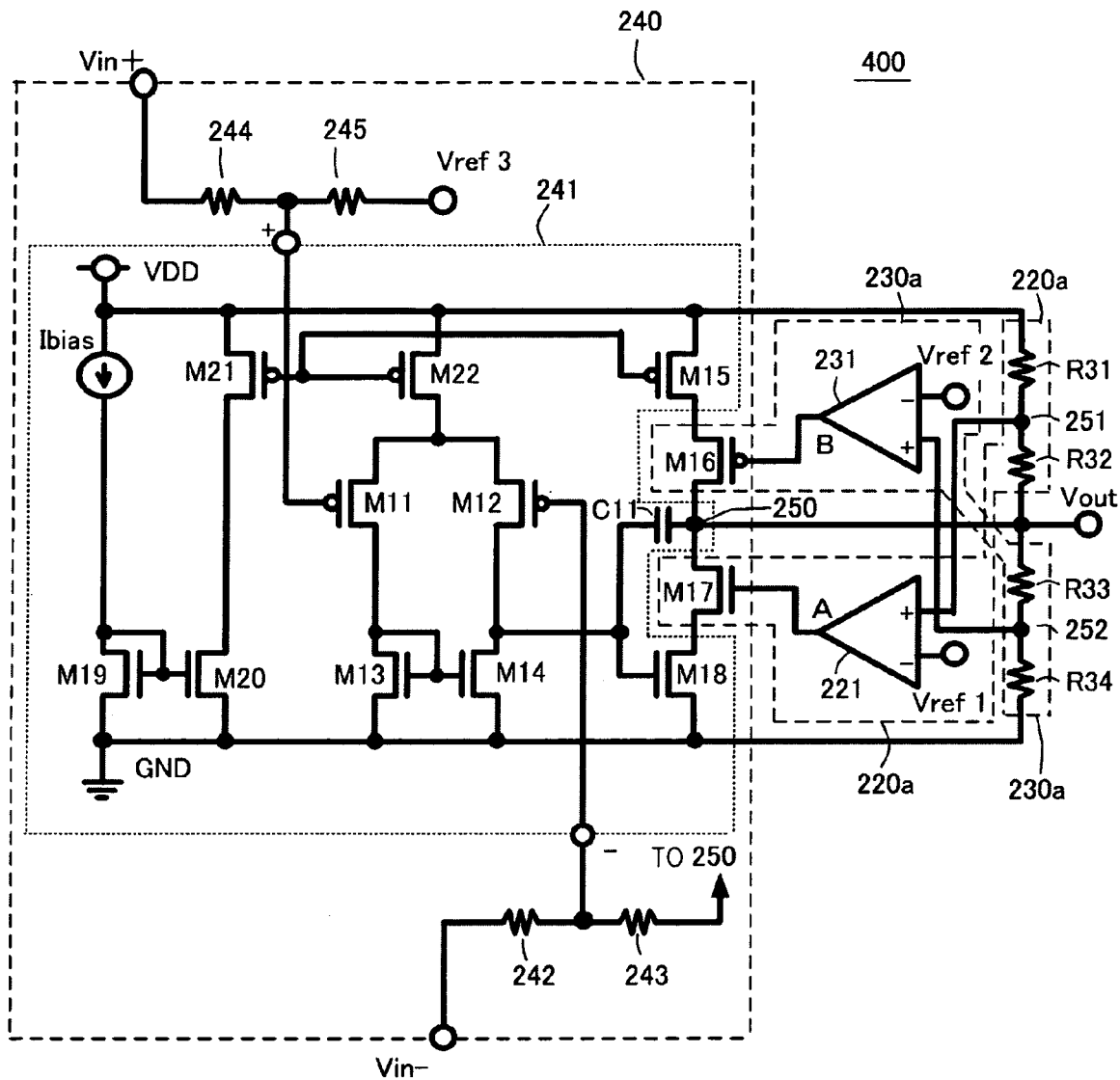
FIG. 5 is a circuit diagram of principal portions of the signal amplification circuit of a second embodiment of the invention.
Figure 6:
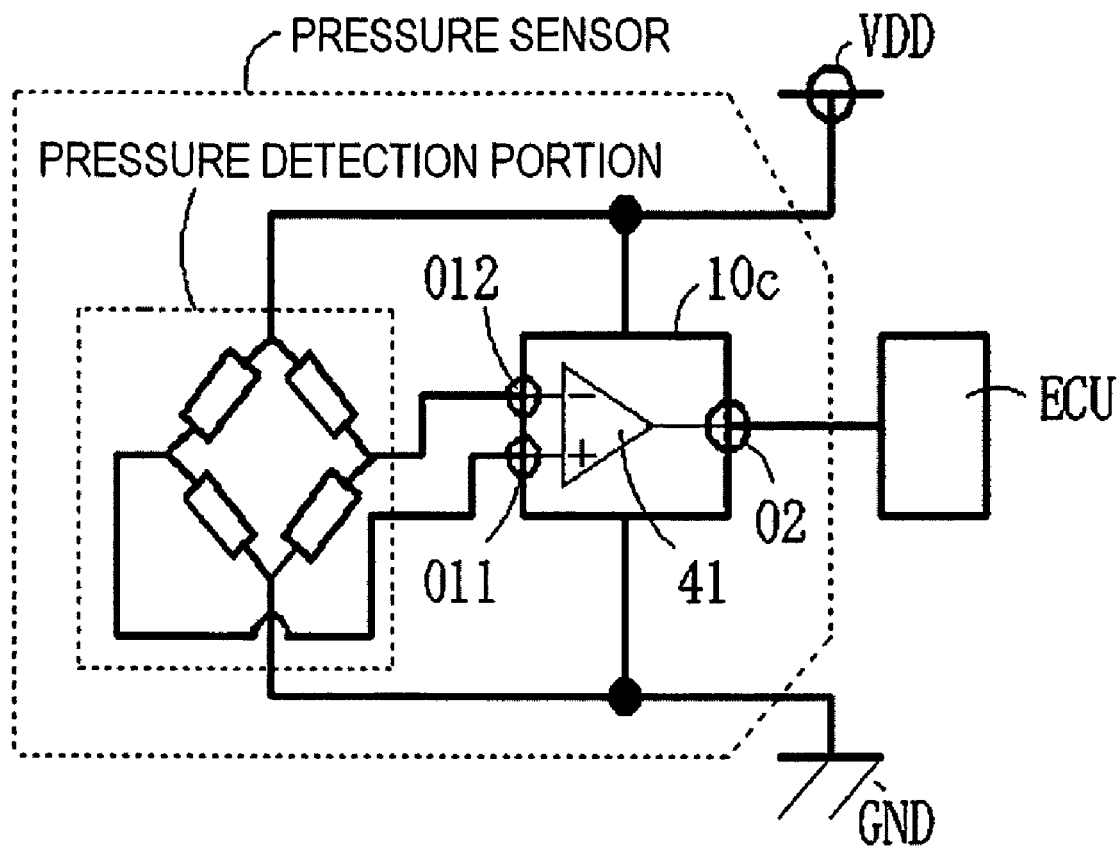
FIG. 6 shows the configuration of principal portions of a conventional pressure sensor.
Figure 7:
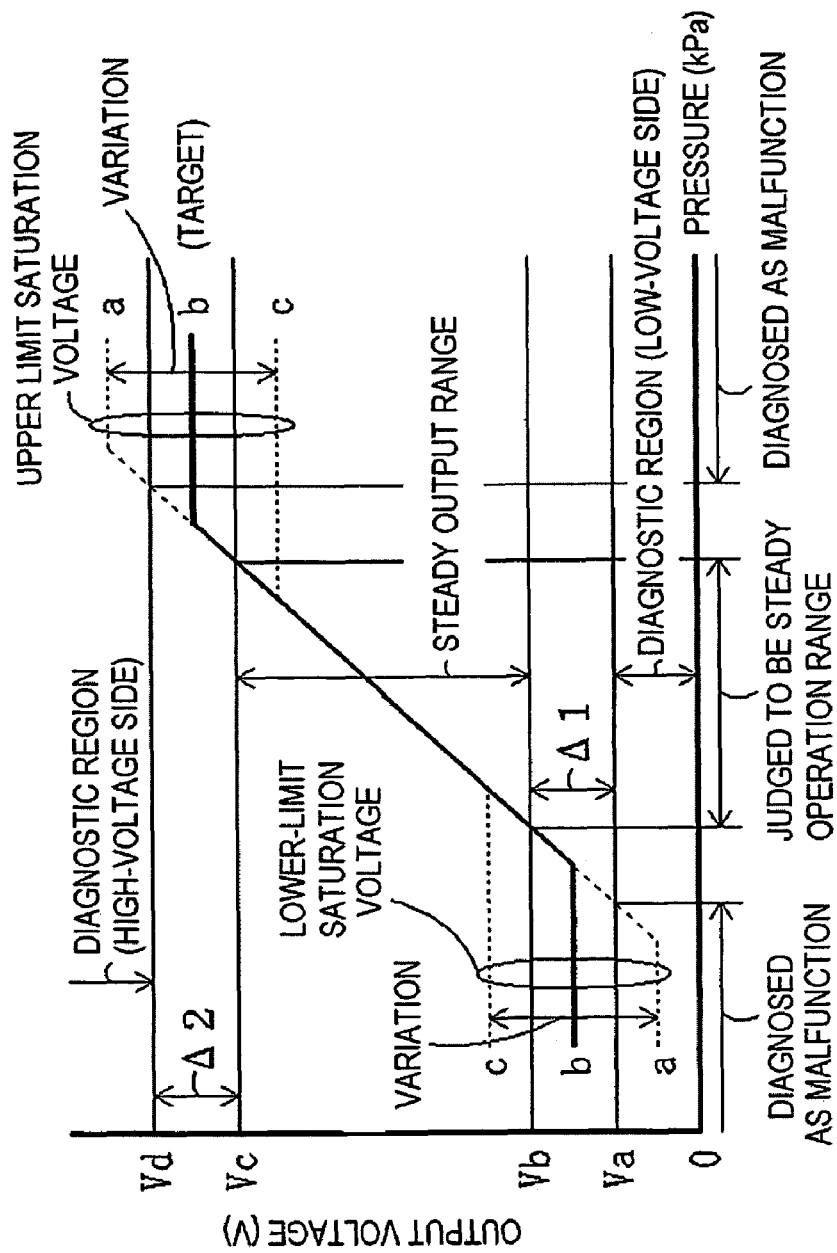
FIG. 7 is a conceptual diagram representing output characteristics and a diagnostic function of a pressure sensor.
Figure 8:
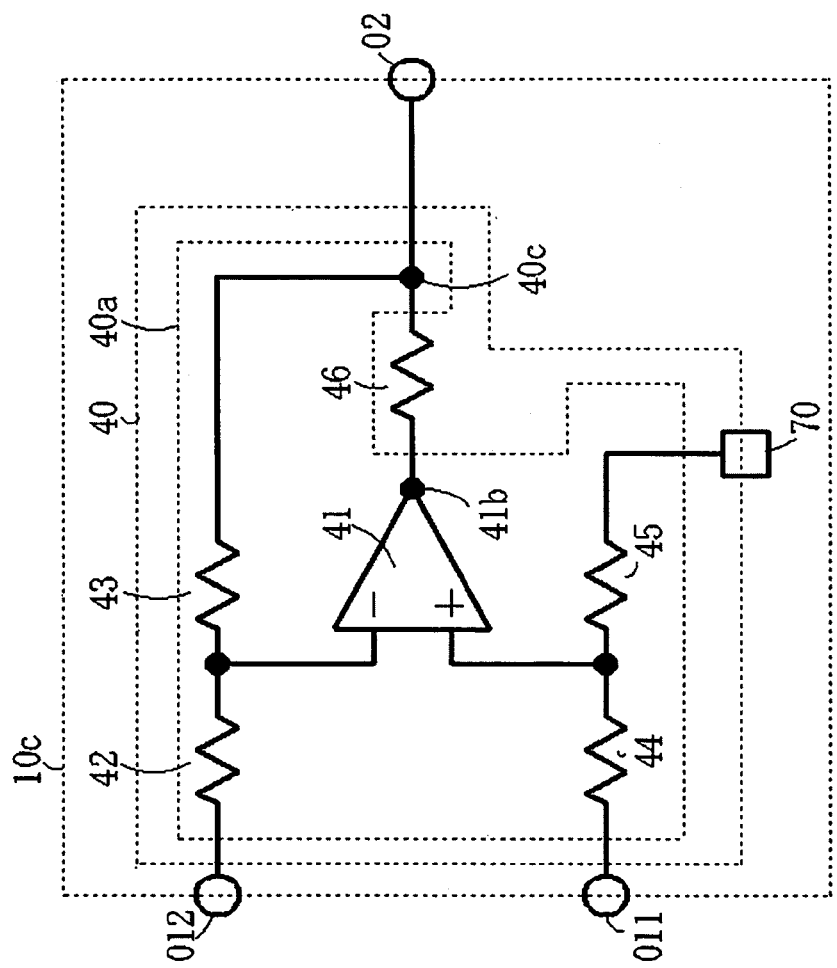
FIG. 8 is a signal amplification circuit diagram used as a general signal processing circuit of a pressure sensor.
Figure 9:
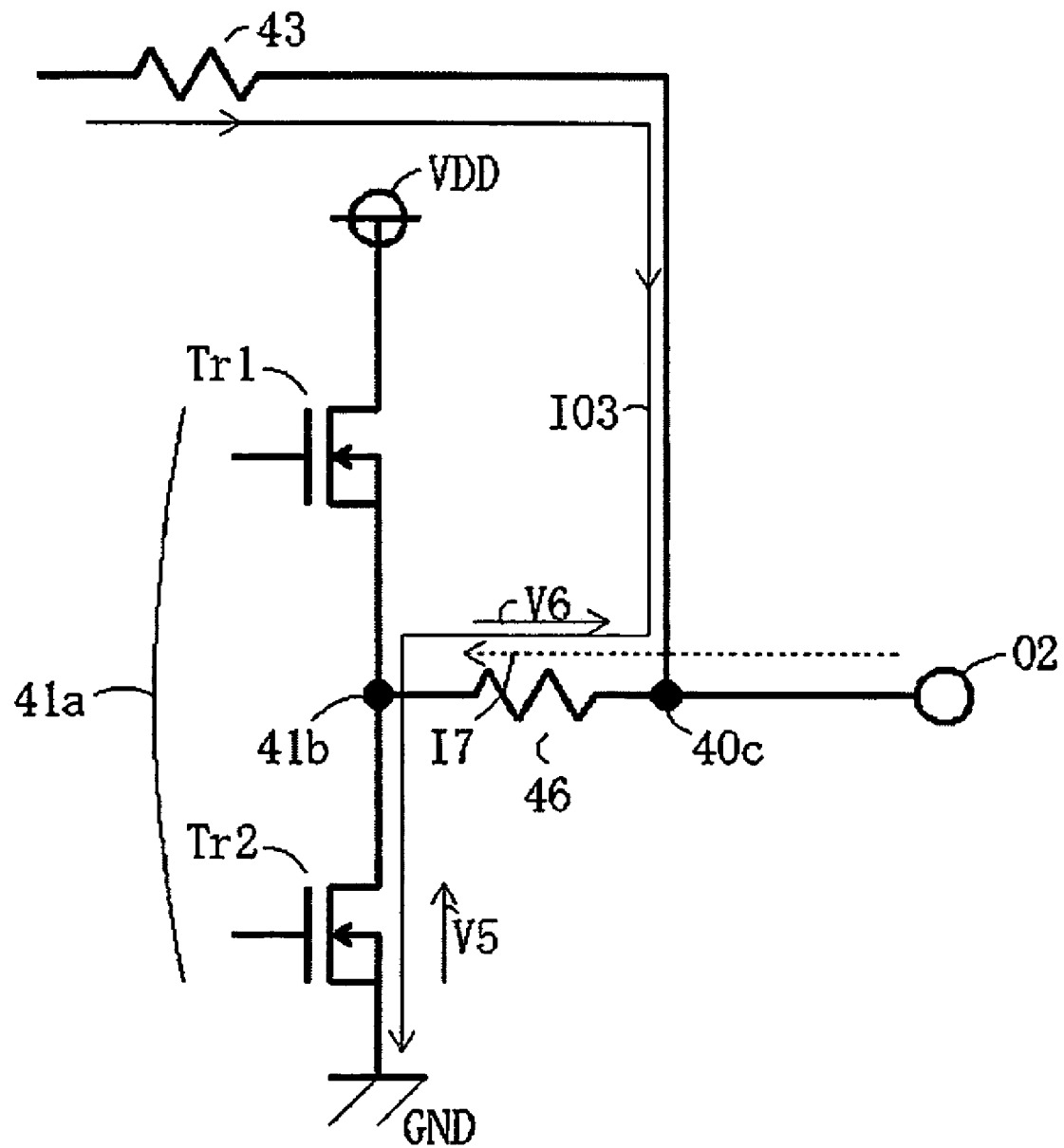
FIG. 9 explains the output lower-limit saturation voltage.
Figure 10:
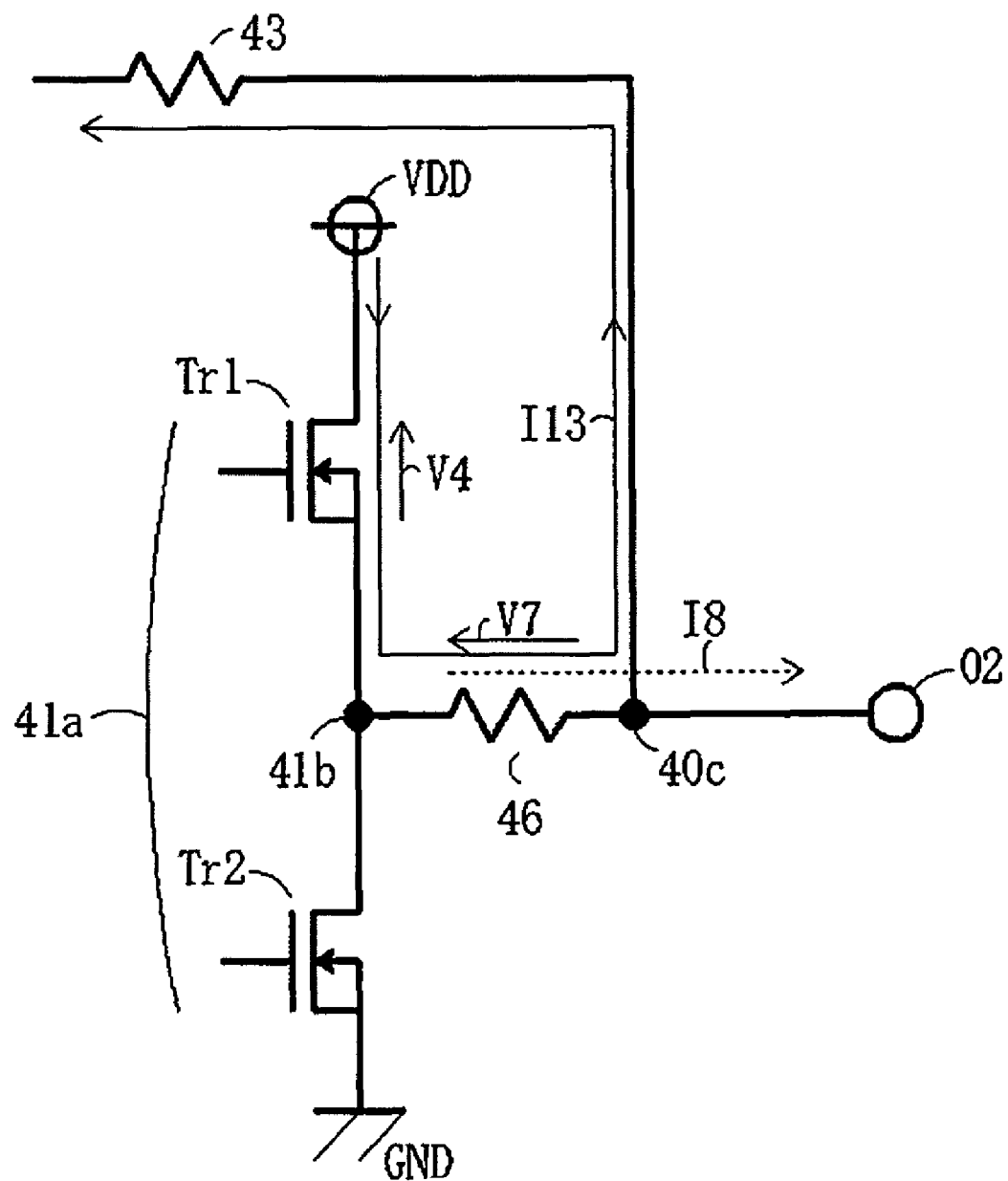
FIG. 10 explains the output upper-limit saturation voltage.
Figure 11:
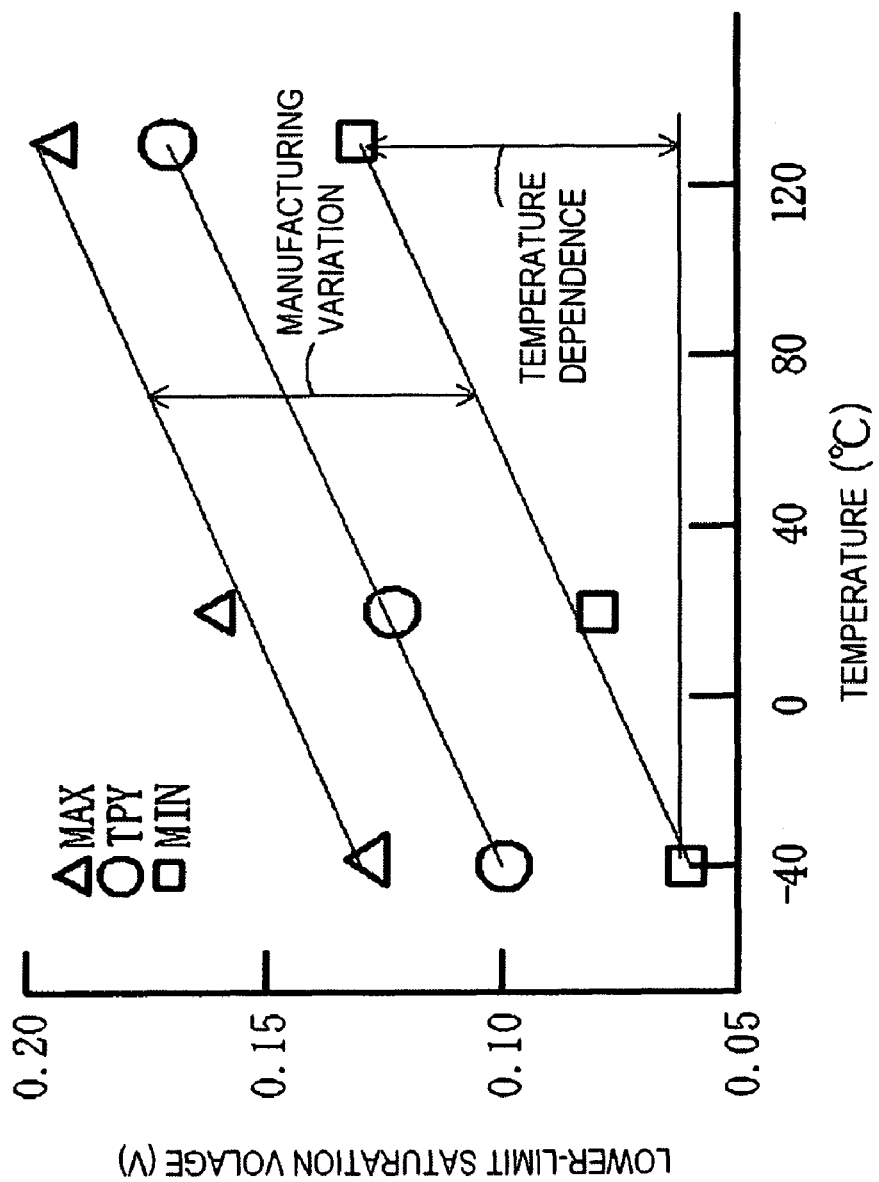
FIG. 11 shows the temperature dependence and manufacturing variation range of the lower-limit saturation voltage in a signal amplification circuit of the prior art.

FIG. 5 is a circuit diagram of principal portions of the signal amplification circuit of a second embodiment of the invention. The same elements as in FIG. 1 are denoted by the same numerals as in FIG. 1. Differences from FIG. 1 include the fact that voltage division between VDD and ground is performed by the resistors R31 to R34, the connection point of R32 and R33 is connected to the Vout terminal, the connection point of R31 and R32 is connected to the + terminal of the op-amp 221, and the connection point of R33 and R34 is connected to the + terminal of the op-amp 231.

This signal amplification circuit 400 comprises a negative feedback amplification circuit 240, upper-limit voltage limiting circuit 230a, and lower-limit voltage limiting circuit 220a. The upper-limit voltage limiting circuit 230a comprises an op-amp 231, R33, R34, and M16; the lower-limit voltage limiting circuit 220a comprises an op-amp 221, R31, R32, and M17.

As explained above, R33 and R34 are series-connected between the output terminal Vout of the op-amp 241 and GND, and R31 and R32 are series-connected between the output terminal Vout of the op-amp 241 and VDD.

The + terminal of the op-amp 231 is connected to the connection point of R33 and R34, the – terminal is connected to Vref2, and the output terminal is connected to the gate terminal of M16.

The + terminal of the op-amp 221 is connected to the connection point of R31 and R32, the – terminal is connected to Vref1, and the output terminal is connected to the gate terminal of M17.

Next, circuit operation is explained. The voltage between VDD and GND is divided by R31 to R34. The potential at connection point 251 between R31 and R32 is the voltage divided by R31 and R32, and this voltage is input to the + terminal of the op-amp 221. The voltage at connection point 252 between R33 and R34 is the voltage divided by R33 and R34, and is input to the + terminal of the op-amp 231. Hence the voltage input to the + terminal of the op-amp 221 is lower than VDD, and the voltage input to the + terminal of op-amp 231 is higher than GND.

Hence the input voltage range determined by the op-amp 231 and the op-amp 221 can be narrowed.

As a result, the circuit configuration can be simplified, the layout area can be reduced, and costs can be reduced.

In raising the precision of the clamping voltage, heightened precision of the input offsets of the op-amp 231 and op-amp 221 is important. In order to achieve this heightened precision, in FIG. 1 op-amps with so-called rule-to-rule inputs, with broad input voltage ranges, must be used as the op-amp 231 and the op-amp 221.

However, by employing the configuration of FIG. 5, high precision for input offsets can be achieved even when using an op-amp 231 and op-amp 221 with narrow input voltage ranges.

Further, the current flowing through these resistors R31 to R34 can be suppressed to µA order by providing a resistance value of approximately several hundred kΩ, so that there is almost no increase in current consumption.

Embodiment 3

In the above embodiments, devices were described having both a lower-limit voltage limiting circuit and an upper-limit voltage limiting circuit; but a device may have only one of these circuits.

FIG. 16 and FIG. 17 are circuit diagrams of principal portions of signal amplification circuits of this invention.

Figure 16A:
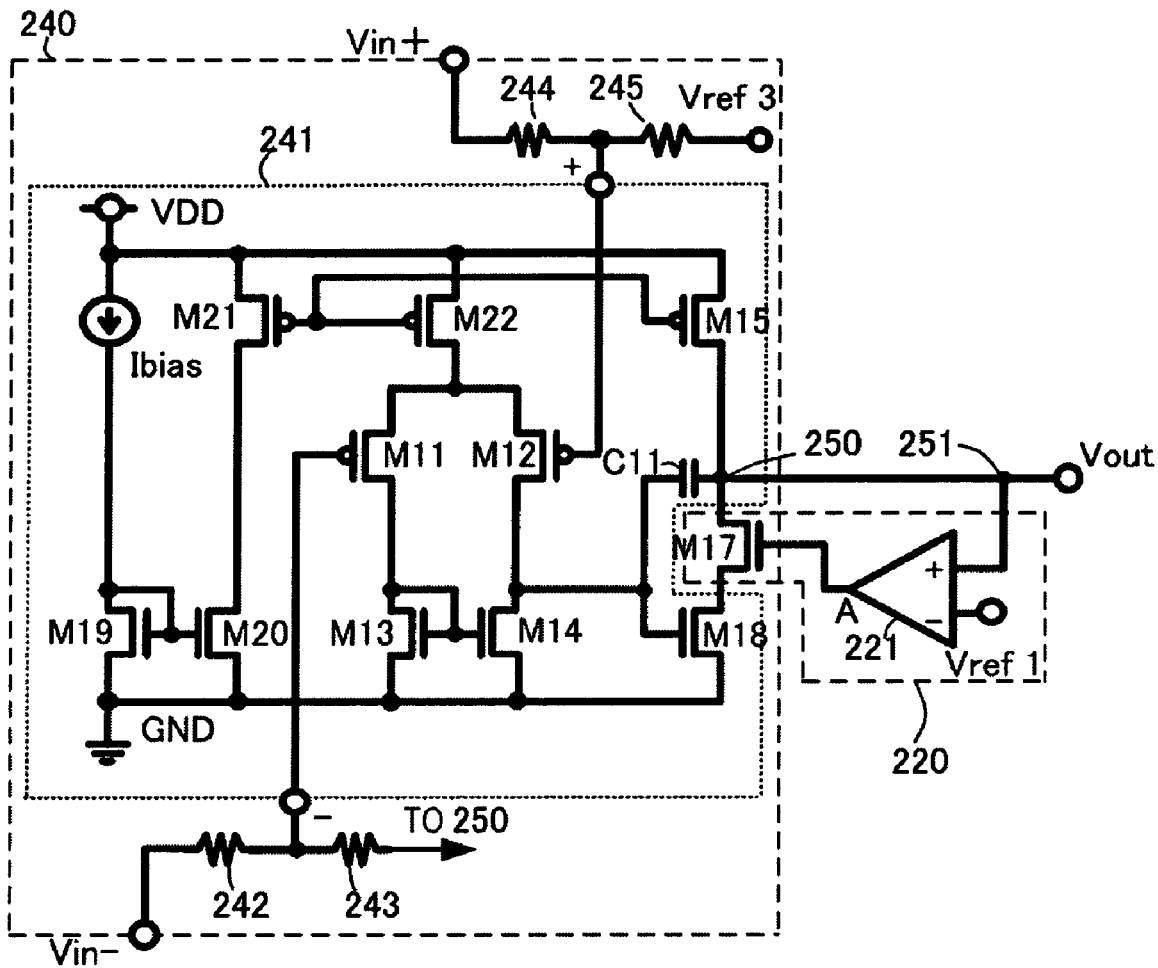
FIG. 16 is a circuit diagram of principal portions of a signal amplification circuit of a third embodiment of the invention.
Figure 16B:
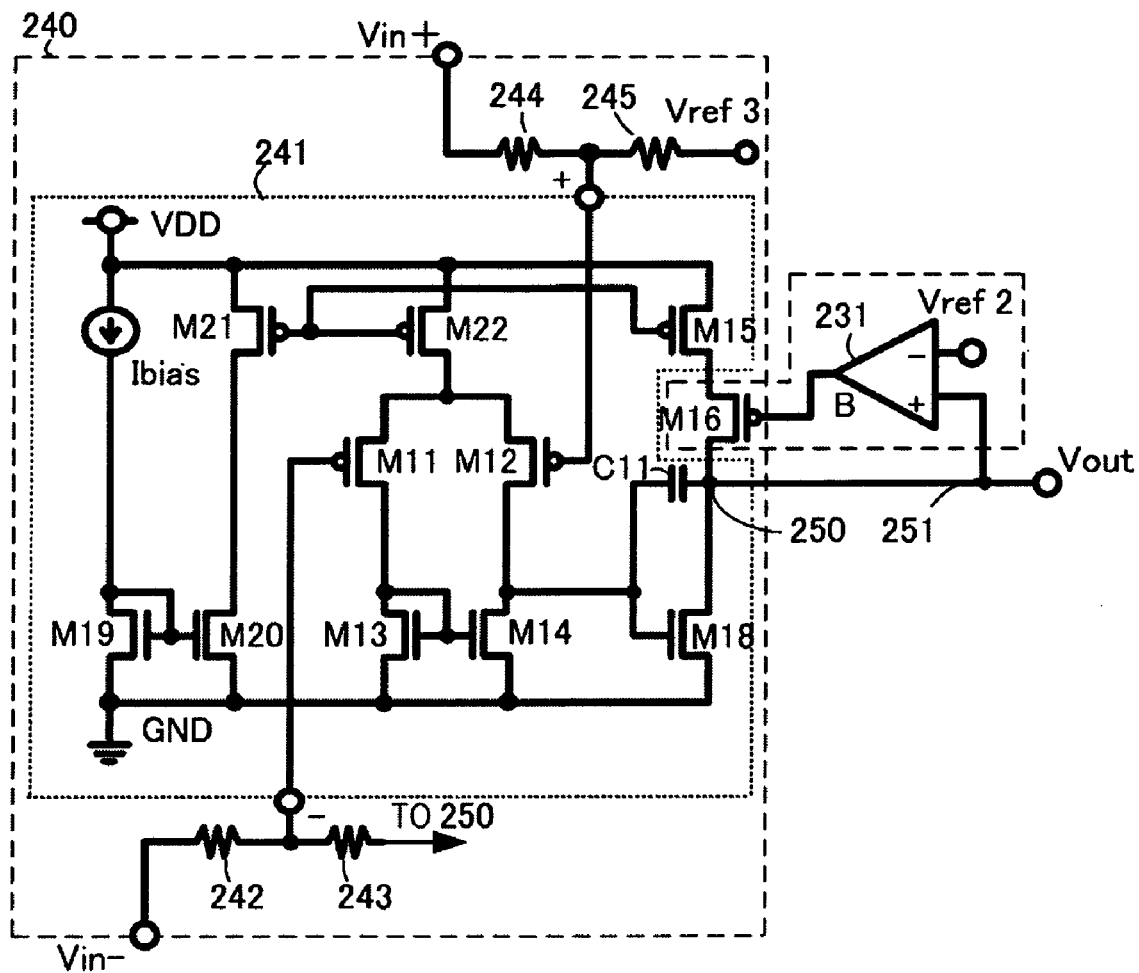

FIG. 16A is the signal amplification circuit of FIG. 1, having only a lower-limit voltage limiting circuit, and FIG. 16B is the signal amplification circuit of FIG. 1, having only an upper-limit voltage limiting circuit. The same elements as in FIG. 1 are denoted by the same reference numerals as in FIG. 1.

Figure 17A:
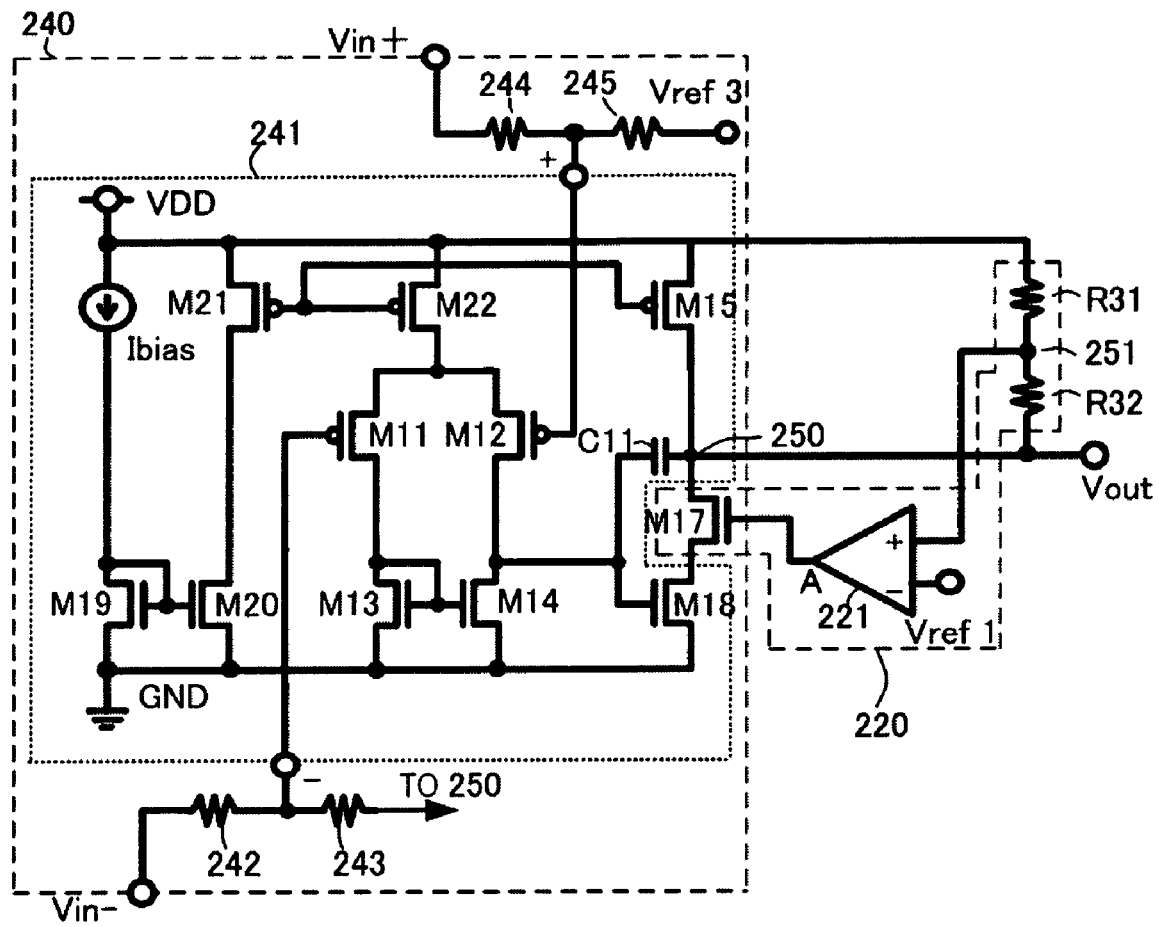
FIG. 17 is a circuit diagram of principal portions of another signal amplification circuit of the third embodiment of the invention.
Figure 17B:
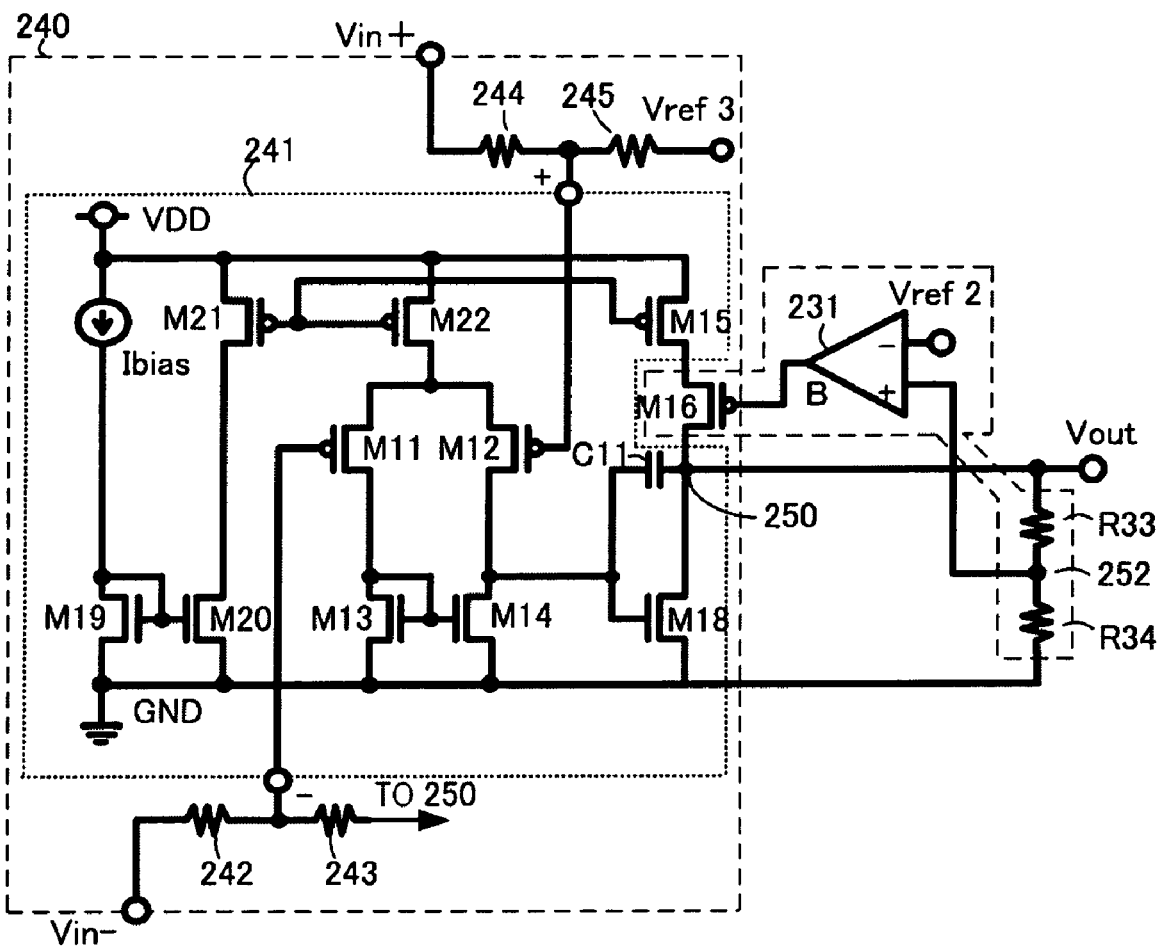

FIG. 17A is the signal amplification circuit of FIG. 5, having only a lower-limit voltage limiting circuit, and FIG. 17B is the signal amplification circuit of FIG. 5, having only an upper-limit voltage limiting circuit. The same elements as in FIG. 5 are denoted by the same reference numerals as in FIG. 5.

In FIG. 16 and FIG. 17 also, the op-amp of FIG. 2 can be used as the op-amp 221, and the op-amp of FIG. 3 can be used as the op-amp 231.

In cases in which only one among the lower-limit and the upper-limit voltage is to be limited, by using the signal amplification circuit according to FIG. 16 or FIG. 17, advantageous results of the invention can be obtained.

In the above embodiments, the low-potential side of the negative feedback amplification circuit was made GND, but in other cases as well, advantageous results of the invention can be similarly obtained.

While MOSFETs are used in the signal amplification circuit of the above exemplary embodiments, this invention may be practiced using field effect transistors of another type, bipolar transistors or any other type of transistors, and therefore should not be construed as limited to the exemplary embodiments set forth herein.

While the present invention has been particularly shown and described with reference to the preferred embodiment thereof, it will be understood by those skilled in the art that the foregoing and other changes in form and details can be made therein without departing from the spirit and scope of the present invention.

What is claimed is:

1. A signal amplification circuit comprising:
a negative feedback amplification circuit employing negative feedback to amplify an input voltage to produce an output voltage;
a first voltage limiting circuit configured to limit the output voltage of the negative feedback amplification circuit, the first voltage limiting circuit increasing a resistance between an output terminal of the negative feedback amplification circuit and a ground terminal when the output voltage of the negative feedback amplification circuit falls below a first reference voltage, to fix a lower-limit saturation voltage of the negative feedback amplification circuit at the first reference voltage; and
a second voltage limiting circuit configured to limit an output voltage of the negative feedback amplification circuit, the second voltage limiting circuit increasing a resistance between the output terminal of the negative feedback amplification circuit and a high-potential side of a power supply of the negative feedback amplification circuit when the output voltage of the negative feedback amplification circuit rises above a second reference voltage, to fix an upper-limit saturation voltage of the negative feedback amplification circuit at the second reference voltage,
wherein the negative feedback amplification circuit further comprises:
a first reference voltage source,
a second reference voltage source,
a first p-channel transistor connected between the high-potential side of a power supply of the negative feedback amplification circuit and the output terminal of the negative feedback amplification circuit,
a second p-channel transistor connected between the high-potential side of the power supply of the negative feedback amplification circuit and the output terminal of the negative feedback amplification circuit, and series-connected with the first p-channel transistor,
a first n-channel transistor connected between a low-potential side of the power supply of the negative feedback amplification circuit and the output terminal of the negative feedback amplification circuit, and a second n-channel transistor connected between the low-potential side of the power supply of the negative feedback amplification circuit and the output terminal of the negative feedback amplification unit, and series-connected with the first n-channel transistor; wherein:

the first voltage limiting circuit comprises a first op-amp having an inverting input terminal thereof connected to the first reference voltage source, a non-inverting input terminal thereof connected to the output terminal of the negative feedback amplification circuit and an output terminal thereof connected to a gate terminal of the second n-channel transistor; and the second voltage limiting circuit comprises a second op-amp having an inverting input terminal thereof connected to the second reference voltage source, a non-inverting input terminal thereof connected to the output terminal of the negative feedback amplification circuit and an output terminal thereof connected to a gate terminal of the second p-channel transistor.

2. The signal amplification circuit according to claim 1, wherein:

the second n-channel transistor is connected between the first n-channel transistor and the output terminal of the negative feedback amplification circuit, and the second p-channel transistor is connected between the first p-channel transistor and the output terminal of the negative feedback amplification circuit.

3. The signal amplification circuit according to claim 1, wherein:

the negative feedback amplification circuit comprises a third op-amp, first to fourth resistors, a positive input terminal, a negative input terminal, and a third reference voltage source;

a first end of the first resistor is connected to the negative input terminal, and a second end of the first resistor is connected to a first end of the second resistor;

a first end of the third resistor is connected to the positive input terminal, and a second end of the third resistor is connected to a first end of the fourth resistor;

a connection point between the first resistor and the second resistor is connected to an inverting input terminal of the third op-amp;

a connection point between the third resistor and the fourth resistor is connected to a non-inverting input terminal of the third op-amp;

a second end of the second resistor is connected to the output terminal of the negative feedback amplification circuit; and a second end of the fourth resistor is connected to the third reference voltage source.

4. The signal amplification circuit according to claim 1, further comprising:

a first phase compensation capacitor, connected between the output terminal of the first op-amp and the output of an input transistor of the first op-amp;

a second phase compensation capacitor, connected between the output terminal of the second op-amp and the output of an input transistor of the second op-amp; and a third phase compensation capacitor, connected between the output terminal of the negative feedback amplification circuit and the output of an input transistor of the negative feedback amplification circuit.

5. The signal amplification circuit according to claim 1, wherein:

the first voltage limiting circuit comprises a fifth resistor and a sixth resistor series-connected between the high-potential side of the power supply of the negative feedback amplification circuit and the output terminal of the negative feedback amplification circuit; and the second voltage limiting circuit comprises a seventh resistor and a eighth resistor series-connected between the low-potential side of the power supply of the negative feedback amplification circuit and the output terminal of the negative feedback amplification circuit.

6. A signal amplification circuit comprising:

a negative feedback amplification circuit employing negative feedback to amplify an input voltage to produce an output voltage;

a lower-limit voltage limiting circuit configured to increase a resistance between an output terminal of the negative feedback amplification circuit and a ground terminal when the output voltage of the negative feedback amplification circuit falls below a first reference voltage, to fix a lower-limit saturation voltage of the negative feedback amplification circuit at the first reference voltage, wherein the negative feedback amplification circuit further comprises:

a first n-channel transistor connected between a low-potential side of a power supply of the negative feedback amplification circuit and the output terminal of the negative feedback amplification circuit, and a second n-channel transistor connected between the low-potential side of the power supply of the negative feedback amplification circuit and the output terminal of the negative feedback amplification circuit and series-connected with the first n-channel transistor; and the lower-limit voltage limiting circuit has a first op-amp having an inverting input terminal thereof connected to the first reference voltage source, a non-inverting input terminal thereof connected to the output terminal of the negative feedback amplification circuit and an output terminal thereof connected to a gate terminal of the second n-channel transistor.

7. The signal amplification circuit according to claim 6, further comprising:

a first phase compensation capacitor, connected between the output terminal of the first op-amp and the output of an input transistor of the first op-amp; and a second phase compensation capacitor, connected between the output terminal of the negative feedback amplification circuit and the output of an input transistor of the negative feedback amplification circuit.

8. The signal amplification circuit according to claim 6, further comprising a resistor between the non-inverting input terminal of the first op-amp and the output terminal of the negative feedback amplification circuit.

9. A signal amplification circuit comprising:

a negative feedback amplification circuit employing negative feedback to amplify an input voltage to produce an output voltage;

an upper-limit voltage limiting circuit configured to increase a resistance between an output terminal of the negative feedback amplification circuit and a high-potential side of a power supply of the negative feedback amplification circuit when the output voltage of the negative feedback amplification circuit rises above a first reference voltage, to fix an upper-limit saturation voltage of the negative feedback amplification circuit at the first reference voltage, wherein the negative feedback amplification circuit further comprises:
a first p-channel transistor connected between the high-potential side of a power supply of the negative feedback amplification circuit and the output terminal of the negative feedback amplification circuit, and
a second p-channel transistor connected between the high-potential side of the power supply of the negative feedback amplification circuit and the output terminal of the negative feedback amplification circuit and series-connected with the first p-channel transistor; and
the upper-limit voltage limiting circuit comprises a first op-amp having an inverting input terminal thereof connected to the first reference voltage source, a non-inverting input terminal thereof connected to the output terminal of the negative feedback amplification circuit and an output terminal thereof connected to a gate terminal of the second p-channel transistor.

10. The signal amplification circuit according to claim 9, further comprising:
a first phase compensation capacitor, connected between the output terminal of the first op-amp and the output of an input transistor of the first op-amp, and
a second phase compensation capacitor, connected between the output terminal of the negative feedback amplification circuit and the output of an input transistor of the negative feedback amplification circuit.

11. The signal amplification circuit according to claim 9, further comprising a resistor between the non-inverting input terminal of the first op-amp and the output terminal of the negative feedback amplification circuit.

* * * * *